US011127627B2

(12) United States Patent
Lazzarino et al.

(10) Patent No.: US 11,127,627 B2
(45) Date of Patent: Sep. 21, 2021

(54) METHOD FOR FORMING AN INTERCONNECTION STRUCTURE

(71) Applicant: IMEC VZW, Leuven (BE)

(72) Inventors: Frederic Lazzarino, Hamme-Mille (BE); Guillaume Bouche, Brussels (BE); Juergen Boemmels, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/695,776

(22) Filed: Nov. 26, 2019

(65) Prior Publication Data

US 2020/0168500 A1   May 28, 2020

(30) Foreign Application Priority Data

Nov. 27, 2018 (EP) ..................................... 18208459

(51) Int. Cl.
| | | |
|---|---|---|
| H01L 21/76 | (2006.01) | |
| H01L 21/768 | (2006.01) | |
| H01L 21/02 | (2006.01) | |

(52) U.S. Cl.
CPC ...... *H01L 21/7681* (2013.01); *H01L 21/0228* (2013.01); *H01L 21/7688* (2013.01); *H01L 21/76813* (2013.01); *H01L 21/76879* (2013.01)

(58) Field of Classification Search
CPC ............. H01L 21/0228; H01L 21/0337; H01L 21/7681; H01L 21/76813; H01L 21/76879; H01L 21/7688; H01L 21/76885
See application file for complete search history.

(56) References Cited

U.S. PATENT DOCUMENTS 7,611,980 B2 * 11/2009 Wells .................. H01L 21/0337
257/435
8,524,605 B1     9/2013 Chen
(Continued)

FOREIGN PATENT DOCUMENTS

| WO | 2016/022518 A1 | 2/2016 |
| WO | 2017/105445 A1 | 6/2017 |

OTHER PUBLICATIONS

Liu, Hongyi et al., "Layout Decomposition and Synthesis for a Modular Technology to Solve the Edge-Placement Challenges by Combining Selective Etching, Direct Stitching, and Alternating-Material Self Aligned Multiple Patterning Processes", Design-Process-Technology Co-Optimization for Manufacturability X, Proc. of SPIE, vol. 9781, 2016, pp. 97810P-1-97810P-10.

(Continued)

*Primary Examiner* — Mohammed Shamsuzzaman
(74) *Attorney, Agent, or Firm* — McDonnell Boehnen Hulbert & Berghoff LLP

(57) ABSTRACT

A method for forming an interconnection structure for a semiconductor device is provided. The method includes: (i) forming a conductive layer on an insulating layer; (ii) forming above the conductive layer a first set of mandrel lines of a first material; (iii) forming a set of spacer lines of a second material different from the first material, wherein the spacer lines of the second material are formed on sidewalls of the first set of mandrel lines; (iv) forming a second set of mandrel lines of a third material different from the first and second materials, wherein the second set of mandrel lines fill gaps between spacer lines of the set of spacer lines; (v) cutting at least a first mandrel line of the second set of mandrel lines into two line segments separated by a gap by etching said first mandrel line of the second set of mandrel lines selectively to the set of spacer lines and the first set of mandrel lines, cutting at least a first mandrel line (Continued)

of the first set of mandrel lines into two line segments separated by a gap by etching said first mandrel line of the first set of mandrel lines selectively to the set of spacer lines and the second set of mandrel lines; (vi) removing the set of spacer lines, selectively to the first and second sets of mandrel lines, thereby forming an alternating pattern of mandrel lines of the first set of mandrel lines and mandrel lines of the second set of mandrel lines; and (vii) patterning the conductive layer to form a set of conductive lines, wherein the patterning comprises etching while using the alternating pattern of mandrel lines of the first and second sets of mandrel lines as an etch mask.

10 Claims, 18 Drawing Sheets

(56) References Cited

U.S. PATENT DOCUMENTS

| | | | |
|---|---|---|---|
| 8,669,180 B1* | 3/2014 | Lee | H01L 21/31144 438/672 |
| 9,263,325 B1 | 2/2016 | Wei et al. | |
| 9,406,775 B1 | 8/2016 | Bouche et al. | |
| 9,484,258 B1 | 11/2016 | Kim et al. | |
| 9,679,771 B1 | 6/2017 | Chen | |
| 9,679,805 B2 | 6/2017 | Bouche et al. | |
| 9,679,809 B1 | 6/2017 | Kye et al. | |
| 9,691,626 B1 | 6/2017 | Bouche et al. | |
| 9,768,025 B2 | 9/2017 | Siew et al. | |
| 9,812,351 B1 | 11/2017 | Licausi et al. | |
| 9,818,611 B2 | 11/2017 | Devilliers | |
| 9,818,623 B2 | 11/2017 | Stephens et al. | |
| 9,818,640 B1 | 11/2017 | Stephens et al. | |
| 9,818,641 B1 | 11/2017 | Bouche et al. | |
| 9,934,970 B1 | 4/2018 | Burns et al. | |
| 2007/0099431 A1 | 5/2007 | Li | |
| 2014/0083972 A1 | 3/2014 | Oyama et al. | |
| 2014/0213033 A1* | 7/2014 | Brunco | H01L 21/762 438/400 |
| 2016/0042950 A1 | 2/2016 | Dai et al. | |
| 2016/0225640 A1 | 8/2016 | Raley et al. | |
| 2017/0062324 A1* | 3/2017 | Brown | H01L 28/00 |
| 2017/0125248 A1 | 5/2017 | Siew et al. | |
| 2017/0148637 A1* | 5/2017 | deVilliers | H01L 21/31144 |
| 2017/0301552 A1* | 10/2017 | deVilliers | H01L 21/0337 |
| 2018/0053687 A1* | 2/2018 | Lee | H01L 21/3081 |

OTHER PUBLICATIONS

Han, Ting et al., "A Paradigm Shift in Patterning Foundation from Frequency Multiplication to Edge-Placement Accuracy—A Novel Processing Solution by Selective Etching and Alternating-Material Self-Aligned Multiple Patterning", Alternative Lithographic Technologies VIII, Proc. of SPIE, vol. 9777, 2016, pp. 977718-1-977718-16.

Han, Ting et al., "Impacts of Process Variability of Alternating-Material Self-Aligned Multiple Patterning on SRAM Circuit Performance". Design-Process-Technology Co-Optimization for Manufacturability X, Proc. of SPIE, vol. 9781, 2016, pp. 97810E-1-97810E-10.

Han, Ting et al., "Process Development and Edge-Placement Yield Modeling of Alternating-Material Self-Aligned Multiple Patterning", Journal of Micro/Nanolithography, MEMS and MOEMS, vol. 15, No. 3, Jul.-Sep. 2016, 12 pages.

European Search Report, European Patent Application No. 18208459.0, dated May 29, 2019, 8 pages.

* cited by examiner

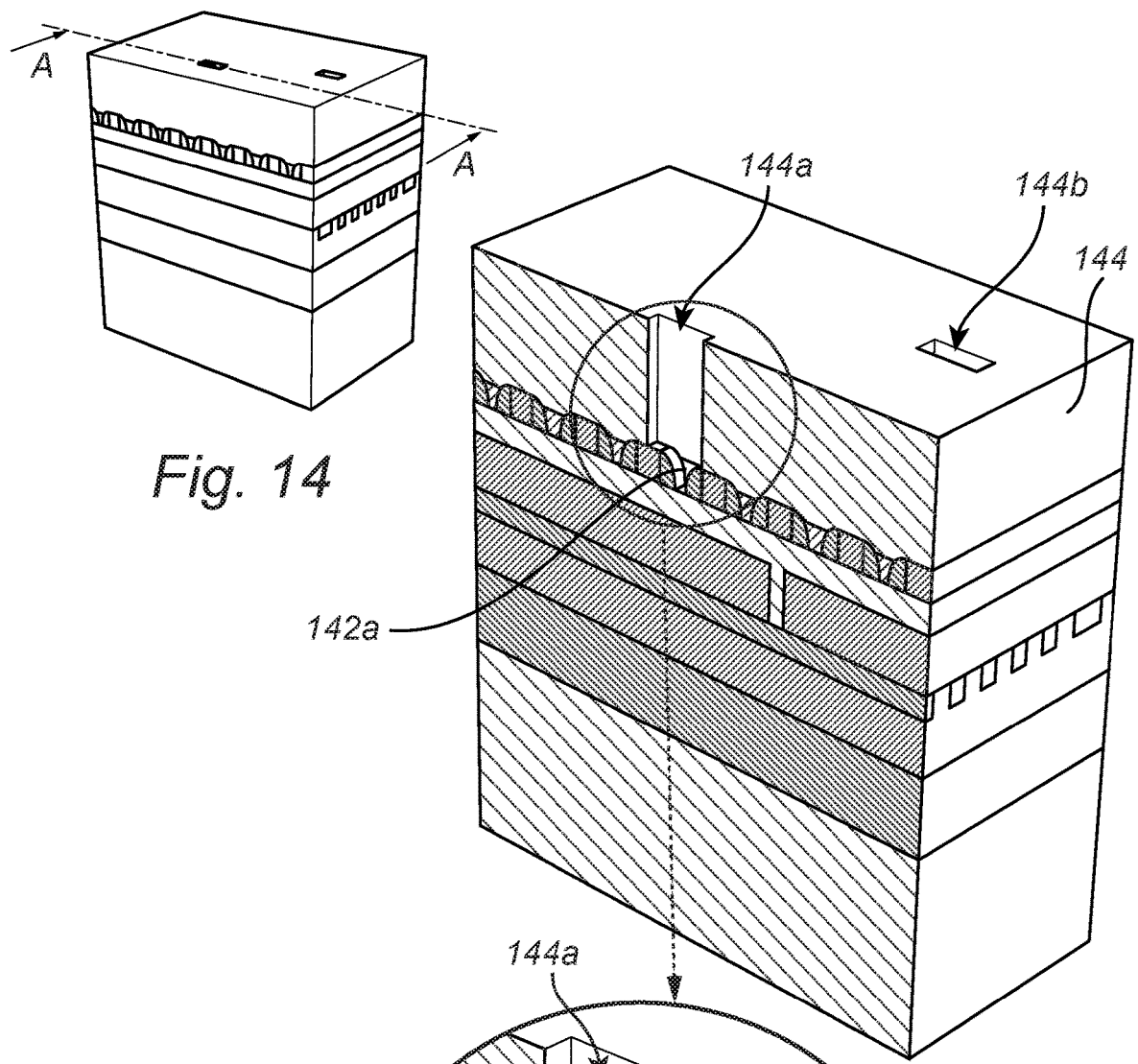
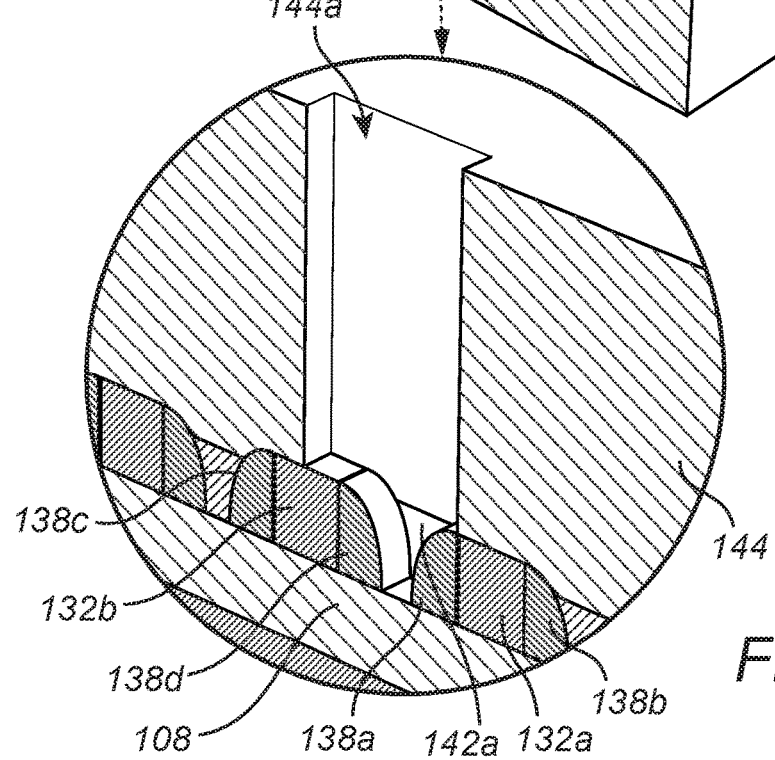
Fig. 14
Fig. 15

METHOD FOR FORMING AN INTERCONNECTION STRUCTURE

CROSS-REFERENCE TO RELATED APPLICATIONS

The present application is a non-provisional patent application claiming priority to European Patent Application No. 18208459.0, filed Nov. 27, 2018, the contents of which are hereby incorporated by reference in its entirety.

TECHNICAL FIELD OF THE DISCLOSURE

The present disclosure relates to a method for forming an interconnection structure.

BACKGROUND OF THE DISCLOSURE

Modern circuit fabrication typically includes processes of forming electrical interconnection structures for interconnecting semiconductor devices in a functioning circuit. An interconnection structure may include one or more interconnection levels or tiers, which may be formed above the active device region. An interconnection level includes horizontal conductive paths or lines arranged in an insulating material layer. Conductive paths of different interconnection levels may be interconnected by conductive vias extending vertically through the insulating layers.

In conventional circuit fabrication, an interconnection level is typically formed in what in the art is known as a "dual damascene process". According to this approach horizontally extending trenches may be etched in an insulating layer. Further, vertically extending via holes may be formed in the insulating layer. Thereafter the trenches and via holes may be simultaneously filled with a conductive material to form conductive lines in the trenches and conductive vias in the via holes. The process may be repeated to form a stack of interconnection levels.

In modern circuit fabrication, multiple patterning techniques like (litho-etch)$^x$, or pitch splitting techniques such as self-aligned double patterning (SADP) or quadruple patterning (SAQP), may be typically employed during trench formation to enable conductive line patterns with sub-lithographic critical dimensions. Forming of an interconnection level typically involves forming a plurality of "cut" conductive lines, i.e. interrupted or discontinuous line segments separated by a gap. "Line cuts" may be typically made by trench blocking techniques wherein discontinuous trenches with two or more separate trench sections may be formed in the dielectric layer. The separate trench sections may then be filled with the conductive material in accordance with the dual damascene process.

However, using state-of-the-art patterning and block techniques makes it increasingly difficult to meet the desire for the ever more aggressive line pitches (38 nm is presently considered to be at the processing limit for SADP). Making line cuts without affecting closely spaced adjacent lines can be especially challenging, due to edge placement errors (EPE) among others.

SUMMARY OF THE DISCLOSURE

An objective of the present disclosure is thus to provide a method allowing forming of interconnection structures comprising tight-pitch conductive lines. A further objective is to enable forming of cut lines in a reliable and precise manner. Further and alternative objectives may be understood from the following According to an aspect of the present disclosure there is provided a method for forming an interconnection structure for a semiconductor device, the method comprising:

forming a conductive layer on an insulating layer;

forming above the conductive layer a first set of mandrel lines of a first material;

forming a set of spacer lines of a second material different from the first material, wherein the spacer lines are formed on sidewalls of the first set of mandrel lines;

forming a second set of mandrel lines of a third material different from the first and second materials, wherein the second mandrel lines fill gaps between the spacer lines;

cutting at least a first mandrel line of the second set of mandrel lines into two line segments separated by a gap by etching said first mandrel line of the second set of mandrel lines selectively to the set of spacer lines and the first set of mandrel lines;

cutting at least a first mandrel line of the first set of mandrel lines into two line segments separated by a gap by etching said first mandrel line of the first set of mandrel lines selectively to the set of spacer lines and the second set of mandrel lines;

removing the set of spacer lines, selectively to the first and second sets of mandrel lines, thereby forming an alternating pattern of mandrel lines of the first set and mandrel lines of the second set; and patterning the conductive layer to form a set of conductive lines, wherein the patterning comprises etching while using the alternating pattern of mandrel lines as an etch mask.

The method of the disclosure allows for formation of tight pitch conductive line patterns. Contrasting a conventional damascene-style process in which the conductive lines may be formed by the portions of the conductive material layer deposited in pre-patterned trenches, the process of the disclosure forms the conductive lines by etching the deposited conductive layer. The conductive lines may accordingly be directly "printed" in the conductive layer.

Each conductive line of the set of conductive lines may be formed by a respective conductive layer portion located under a mandrel line of either the first set or second set of mandrel lines. The locations of the first and second sets of mandrel lines define the locations of the set of conductive lines to be formed in the conductive layer. The spacer lines define the spacing of the conductive lines to be formed in the conductive layer.

Forming the first and second sets of mandrel lines of a first material and a third different material, respectively, provides etch contrast allowing selective cutting of either the first or second mandrel lines. The alternating pattern of first and second mandrel lines enables a doubled pitch for mandrel lines of a same material and hence reduces the sensitivity to EPEs during a cutting process.

The gaps formed by cutting the mandrel lines may be transferred to corresponding gaps in the conductive lines. Tone inversion schemes typically employed in conventional trench blocking techniques may thus be avoided. Tone inversion techniques may be comparably expensive process wise and also hamper yield.

By the terminology "using a layer as an etch mask" is hereby meant that one or more underlying layers may be etched while said layer counteracts etching of the underlying layer(s) in regions covered by said layer. The underlying layer(s) may hence etched selectively to said layer acting as an etch mask.

By etching of a feature "A" of a first material, selectively to (i.e. with respect to) a feature "B" of a second material, is hereby meant exposing the features A and B to an etch process wherein the feature A is etched at a greater rate than the feature B. This may be achieved by selecting the material of feature A and the material of feature B as a combination of materials presenting different etch rates in the etch process. Hence, portions of the feature A exposed to the etching process may be removed while portions of the feature B exposed to the etch process may be preserved. The preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may be 2:1 or higher, 10:1 or higher, or 40:1 or higher, depending inter alia on the duration of the etching and the relative dimensions of the features A and B.

The first material of the first set of mandrel lines, the second material of the spacer lines and the third material of the second set of mandrel lines may be selected as any three materials which may be etched selectively to one another. That is, the first material may be etched selectively to the second material and the third material. The second material may be etched selectively to the first material and the third material. The third material may be etched selectively to the first and second material.

In some embodiments, the first and third material may be different materials selected from: a carbon-comprising material, a silicon-comprising material. The second material may be an oxide material or a nitride material. Materials selected from these groups of materials enable etching with a degree of selectivity. Moreover, many carbon- and silicon-comprising materials may form an efficient etch mask during etching of a conductive layer formed by a metal layer.

In some embodiments, the conductive layer may be a Ru-layer. A Ru-layer enables low resistance signal routing and allows etching of aggressive pitch line patterns.

By the patterning of the conductive layer, the pattern defined by the first and second sets of mandrel lines may be transferred into the conductive layer. The pattern transfer may be a direct pattern transfer: The conductive layer may be etched while using the pattern defined by the first and second sets of mandrel lines as an etch mask. The conductive lines may accordingly be formed by conductive layer portions masked by the pattern of the first and second sets of mandrel lines.

The pattern transfer may also be an indirect or sequential pattern transfer: An intermediate layer (intermediate the pattern defined by the first and second sets of mandrel lines and the conductive layer) may be patterned by etching while using the pattern defined by the first and second sets of mandrel lines as an etch mask. The conductive layer may thereafter be etched while using the patterned intermediate layer, separately or in combination with the pattern defined by the first and second sets of mandrel lines, as an etch mask. Sequential pattern transfer may allow for the materials for the mandrel lines and for the spacer lines to be selected with less consideration to etch selectively with respect to the material of the conductive layer. Rather, the intermediate layer may be formed by a material which may act as a reliable etch mask during etching of the conductive layer. For instance, the intermediate layer may be formed by a hard mask material.

The cutting of the first mandrel line of the first set of mandrel lines may comprise:

forming a first cut mask above the first and second mandrel lines and spacer lines;

patterning an opening in the first cut mask, the opening exposing a portion of said first mandrel line of the first set of mandrel lines and having a width greater than a line width of said first mandrel line; and removing said portion of said first mandrel line by etching through the opening of the first cut mask.

Thereby the first mandrel line of the first set of mandrel lines may be cut into two separate mandrel line segments. Subsequent to cutting the first mandrel line, the first cut mask may be removed. The opening width of the first cut mask may greater than a line width of the first mandrel line. In other words, the opening in the cut mask may be formed/printed with relaxed dimensions compared to the line width of the first mandrel line. Since the cutting involves etching the first mandrel line selectively to the spacer lines and the second set of mandrel lines, a relaxed dimension of the cut opening will not result in cutting of a spacer line or cutting of a mandrel line of the second set of mandrel lines. Accordingly, the cut opening may be formed with a width such that the opening at least partially exposes portions of one or more of the spacer lines on opposite sides of the first mandrel line portion, and possibly also portions of one or more mandrel lines of the second set of mandrel lines, adjacent to the one or more spacer lines.

Optionally, the opening in the first cut mask may be defined as an elongated opening to expose respective portions of a subset of the first set of mandrel lines. Thereby the subset of mandrel lines may be cut simultaneously by etching through the opening. This approach may render the cutting process more efficient.

The cutting of the first mandrel line of the second set of mandrel lines may comprise:

forming a second cut mask above the first and second mandrel lines and spacer lines;

patterning an opening in the second cut mask, the opening exposing a portion of said first mandrel line of the second set of mandrel lines and having a width greater than a line width of said first mandrel line; and removing said portion of said first mandrel line by etching through the opening of the second cut mask.

Thereby the first mandrel line of the second set of mandrel lines may be cut into two separate mandrel line segments, Subsequent to cutting the first mandrel line, the second cut mask may be removed. The opening width of the second cut mask may be greater than a line width of the first mandrel line In other words, the opening in the cut mask may be formed/printed with relaxed dimensions compared to the line width of the first mandrel line. Since the cutting involves etching the first mandrel line selectively to the spacer and the first set of mandrel lines, a relaxed dimension of the cut opening will not result in cutting of a spacer line or cutting of a mandrel line of the second set of mandrel lines. Accordingly, the cut opening may be formed with a width such that the opening at least partially exposes portions of one or more of the spacer lines on opposite sides of the first mandrel line portion, and possibly also portions of one or more mandrel lines of the first set of mandrel lines, adjacent to the one or more spacer lines.

Optionally, the opening in the second cut mask may be defined as an elongated opening to expose respective portions of a subset of the second set of mandrel lines. Thereby the subset of mandrel lines may be cut simultaneously by etching through the opening. This approach may render the cutting process more efficient.

According to one embodiment, forming the first set of mandrel lines comprises:

forming a first mandrel layer of the first material; and patterning the first mandrel layer to form the first set of mandrel lines, wherein the patterning comprises etching the first mandrel layer while using a second set of spacer lines as an etch mask. The first mandrel lines may thus be formed using a spacer-assisted patterning process.

According to one embodiment, the method further comprises, prior to forming the first set of mandrels, forming at least a first via hole in the insulating layer, the at least first via hole extending through the insulating layer to an underlying conductive structure, wherein forming the conductive layer comprises depositing the conductive layer to cover the insulating layer and filling said at least one via hole.

This embodiment allows forming of tight pitch conductive line patterns in what may be referred to as a "semi-damascene approach". That is, like a conventional dual damascene process, a conductive material layer for forming both the horizontal conductive lines and vias may be deposited over the structure. However, in contrast to the conventional process in which the conductive lines may be formed by the portions of the conductive material layer deposited in pre-patterned trenches, the method of the disclosure comprises forming the conductive lines by etching the deposited conductive layer, i.e. to print the conductive lines in the conductive layer.

A mandrel line of the first set of mandrel lines may extend across the first via hole. Thereby, a first conductive line of the set of conductive lines may be connected to a first underlying conductive structure by a conductive layer portion filling the first via hole (i.e. a first via). Optionally, a mandrel line of the second set of mandrel lines may extend across the second via hole. Thereby, a second conductive line of the set of conductive lines may be connected to a second underlying conductive structure by a conductive layer portion filling the second via hole (i.e. a second via).

An upper surface of the deposited conductive layer may present a varying topography in a first region above the first via hole. The forming of the first set of mandrel lines may comprise aligning the first set of mandrel lines using the varying topography in the first region such that said mandrel line of the first set of mandrel lines runs above said first region. The presence of the first via hole introduces a varying topography in the insulating layer. The varying topography in the insulating layer may result in a corresponding varying topography in an upper surface of the conductive layer (such as a depression in the upper surface of the conductive layer at a position above the via hole). This varying topography may be used as an alignment marker for defining the first set of mandrel lines. For instance, the varying topography may be used as an alignment marker for defining a pattern of an etch mask (such as the above-mentioned second set of spacers) used for patterning the first set of mandrel lines. Since the locations of the first set of mandrel lines directly influence the locations of the spacer lines and in turn the locations of the second set of mandrel lines, the varying topography may hence be used to facilitate aligning the set of conductive lines with respect to the vias.

According to one embodiment, the method further comprises forming a further insulating layer covering said insulating layer and embedding the set of conductive lines.

BRIEF DESCRIPTION OF THE DRAWINGS

The above, as well as additional objects, features and advantages of the present disclosure, will be better understood through the following illustrative and non-limiting detailed description, with reference to the appended drawings. In the drawings like reference numerals will be used for like elements unless stated otherwise.

As shown in FIG. 5, a first mandrel layer 122 has been formed on the conductive layer 108.

FIG. 14 illustrates a method for forming an interconnection structure and shows a cross section of the structure, still along the line AA as indicated in the inset, subsequent to a line cutting operation.

FIG. 15 illustrates a method for forming an interconnection structure and shows an enlarged cross section of the structure, still along the line AA as indicated in the inset, subsequent to a line cutting operation.

In FIG. 21 the set of spacer lines 138 have been removed, selectively with respect to the first and second sets of mandrel lines 132, 142.

DETAILED DESCRIPTION OF THE DISCLOSURE

Figure 1:
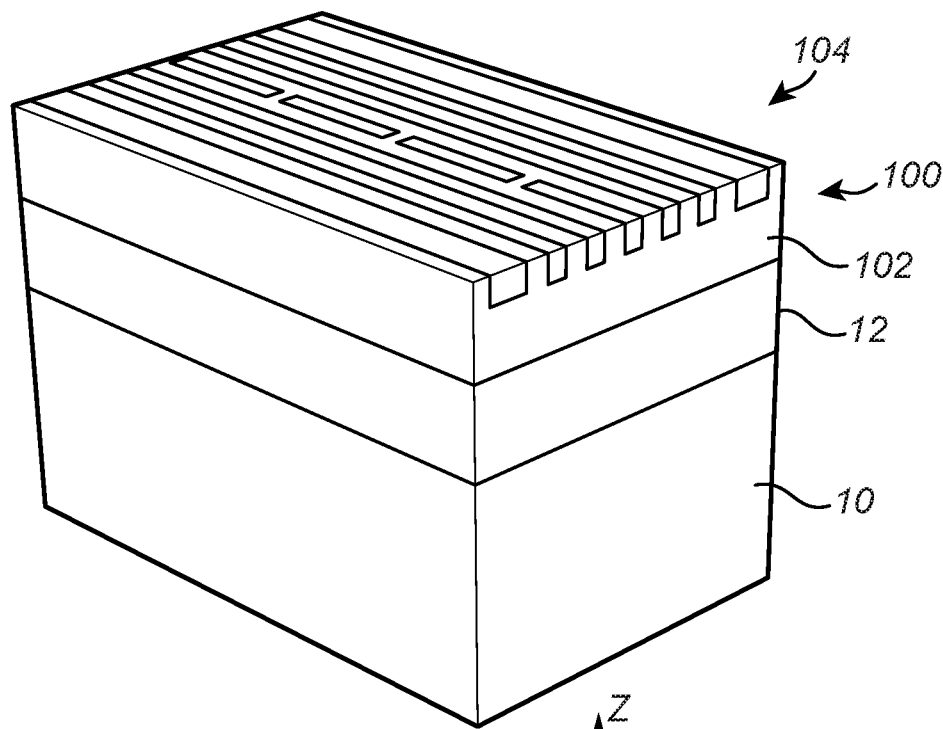
FIG. 1 illustrates a method for forming an interconnection structure and shows a section of an intermediate structure or device. Directions X and Y indicates a first and a second horizontal direction, respectively, (parallel to the main plane of extension of the layers) and Z indicates a vertical direction (normal to the main surface of the layers)

A method for forming an interconnection structure, suitable for instance for a semiconductor device, will now be described with reference to FIGS. 1-24. The method will be described in connection with forming an interconnection layer above a lower interconnection layer comprising a set of conductive lines. It may, however, be noted that the method has a more general applicability for forming an interconnection layer above a dielectric layer embedding other conductive structures than lines, such as semiconductor device contacts (for instance source/drain contacts or gate contacts), With reference to FIG. 1, there is shown, in perspective, a section of an intermediate structure or device. The structure may extend laterally or horizontally beyond the illustrated section. The illustrated planes of section extending through the structure are common to all the figures unless stated otherwise. It may be noted that the relative dimensions of the shown elements, in particular the relative thickness of the layers, is merely schematic and may, for the purpose of illustrational clarity, differ from a physical structure. In FIG. 1, directions X and Y indicates a first and a second horizontal direction, respectively, (parallel to the main plane of extension of the layers) and Z indicates a vertical direction (normal to the main surface of the layers).

The structure comprises a substrate 10, for instance a semiconductor substrate such as a silicon (Si) substrate, a silicon-on-insulator (SOI) substrate, a germanium (Ge) substrate, a SiGe substrate, etc. An active device layer including semiconductor devices such as transistors may be fabricated on a main surface of the substrate 10 and covered by an insulating layer such as an interlayer dielectric, as schematically indicated by device layer 12. The active device layer may also be referred to as a front-end-of-line portion (FEOL-portion).

A lower interconnection layer 100 may be formed above the substrate 10. The interconnection layer 100 comprises a set of horizontal conductive paths/lines 104, typically of metal. The set of conductive paths 104 extend in parallel to the horizontal direction X. As indicated, the paths of the set of conductive paths 104 may be regularly spaced apart along the horizontal direction Y. As further indicated, at least a subset of the conductive paths 104 may be formed with a uniform spacing and uniform line width However as may be seen in FIG. 1, the set of conductive paths 104 may also comprise lines of differing line widths. The set of conductive paths 104 may be connected to underlying conductive structures through vertically extending conductive vias. The set of conductive paths 104 may be arranged in an insulating material layer 102, typically a dielectric layer such as a layer of silicon oxide or some other conventional low-k dielectric layer. For instance, the dielectric layer 102 may be a layer stack comprising, in addition to a low-k dielectric layer, an interface layer and/or an oxide capping layer formed on an upper surface of the low-k dielectric layer. More generally, the materials of the conductive paths 104 and the dielectric layer 102 of the interconnection layer 100 may be of any conventional types used in back-end-of-line (BEOL) interconnect structures The interconnection layer 100 may be formed using conventional BEOL processing, such as a dual damascene approach, or alternatively the method which will be set out in the following.

Figure 2:
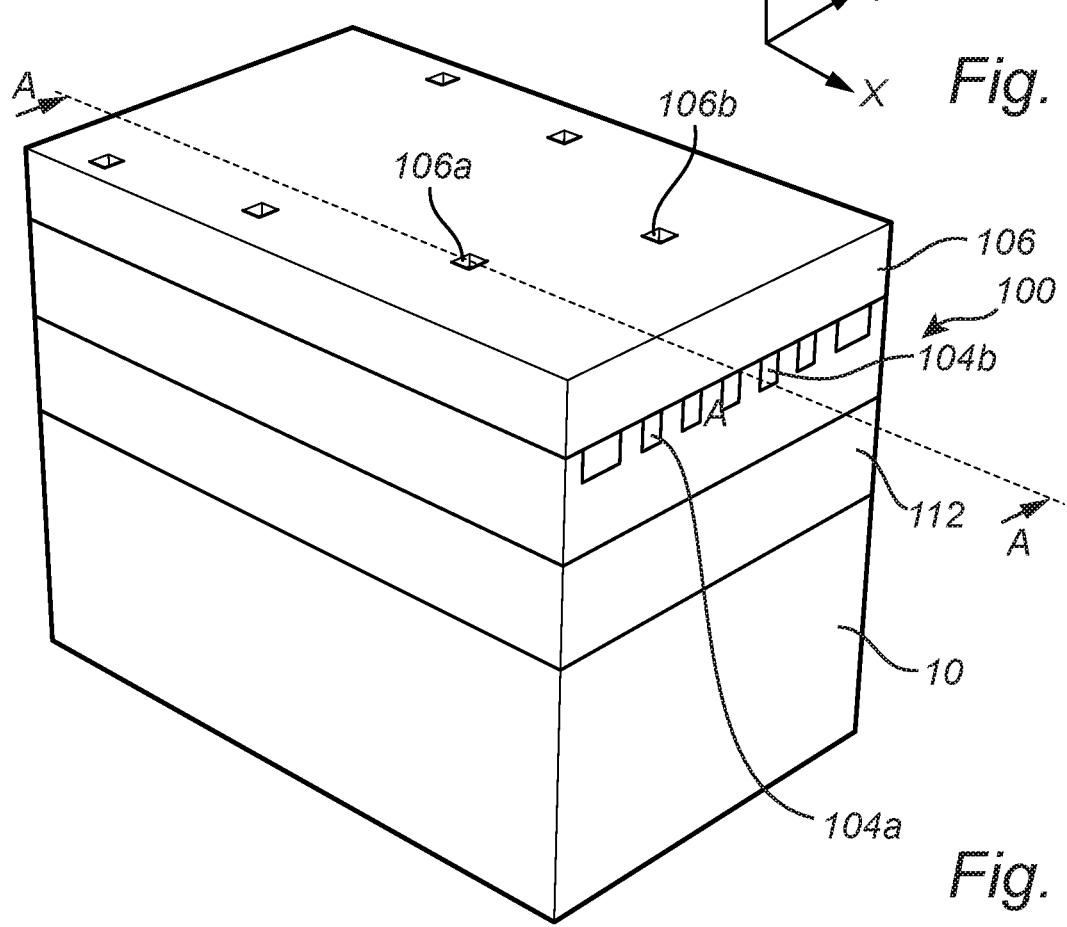
FIG. 2 illustrates a method for forming an interconnection structure and shows an insulating layer 106 formed on the lower interconnection level 100.
Figure 3:
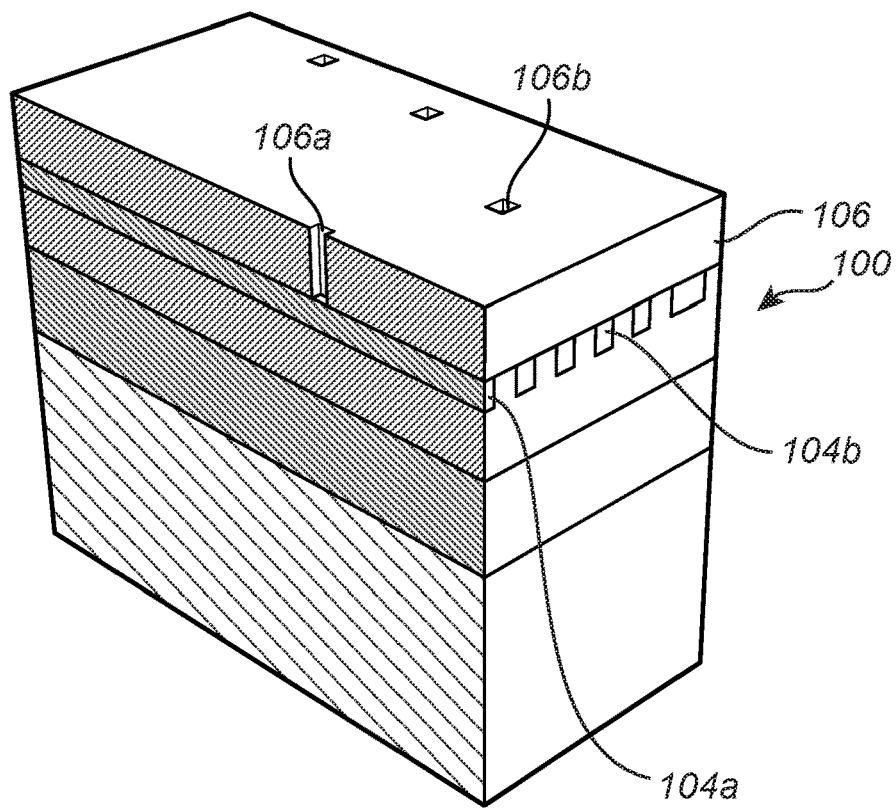
FIG. 3 illustrates a method for forming an interconnection structure and shows a cross-sectional view taken along the line AA indicated in FIG. 2 of an upper surface of a conductive line 104a, 104b of the set of conductive lines 104 of underlying conductive structure.

In FIG. 2, an insulating layer 106 has been formed on the lower interconnection level 100. The insulating layer 106 covers the insulating layer 102 and the set of conductive paths 104. The insulating layer 106 may be a dielectric layer such as a layer of silicon oxide or some other conventional low-k dielectric layer. The insulating layer 106 may be deposited by chemical vapor deposition (CVD), as one example.

A set of via holes, comprising first and second via holes 106a, 106b have been formed in the insulating layer 106, Each one of the via holes 106a, 106b extend through the insulating layer 106 to a respective underlying conductive structure. Each via hole may accordingly expose a surface, typically an upper surface, of an underlying conductive structure, in the illustrated case an upper surface of a conductive line 104a, 104b of the set of conductive lines 104 (visible in the cross-sectional views of FIGS. 3 and 4 taken along the line AA indicated in FIG. 2).

The set of via holes 106a, 106b may be formed using a sequence of lithography and etching steps (a "litho-etch sequence"). Via holes 106a, 106b may be etched in a silicon oxide- or other conventional low-k dielectric layer using for instance a dry etching process such as a reactive ion etch (RIE) or ion beam etching (IBE).

A litho-etch sequence may generally comprise forming a photoresist mask layer on the layer which will be patterned, i.e. "the target layer" (such as the insulating layer 106). A pattern (e.g. a pattern of openings, trenches or lines) may be lithographically defined in the photoresist layer and then transferred into the target layer by etching while using the patterned photoresist layer as an etch mask. The photoresist layer may thereafter be stripped from the target layer. A litho-etch sequence may also comprise forming a lithographic mask layer stack (a "litho stack") on the target layer. The litho stack may comprise a patterning layer as a lower layer of the litho stack. The patterning layer may be an amorphous-carbon film, or some other conventional organic or non-organic patterning film allowing high-fidelity pattern transfer into the target layer in question. The litho stack may further comprise a photoresist layer and a set of transfer layers intermediate the patterning layer and the photoresist layer. The set of intermediate layers may comprise, for instance, one or more anti-reflective coatings such as SiOC layers, SOG layers, and optionally a planarization layer such as an organic spin-on layer (e.g. a SOC layer). A pattern may be lithographically defined in the photoresist layer and subsequently transferred into lower layers of the litho stack, in a number of etch steps, and subsequently into the patterning layer. The pattern transfer process may cause a partial consumption of the litho stack layer stack. For instance, the photoresist layer may be consumed during the transfer process. The litho-etch sequence may conclude by etching the target layer while using the patterned patterning layer as an etch mask. Any remaining layers of the litho stack may thereafter be stripped from the target layer.

FIGS. 4-16 are cross-sectional views along the line AA of the structure, at various stages of the process which will be described in the following.

Figure 4:
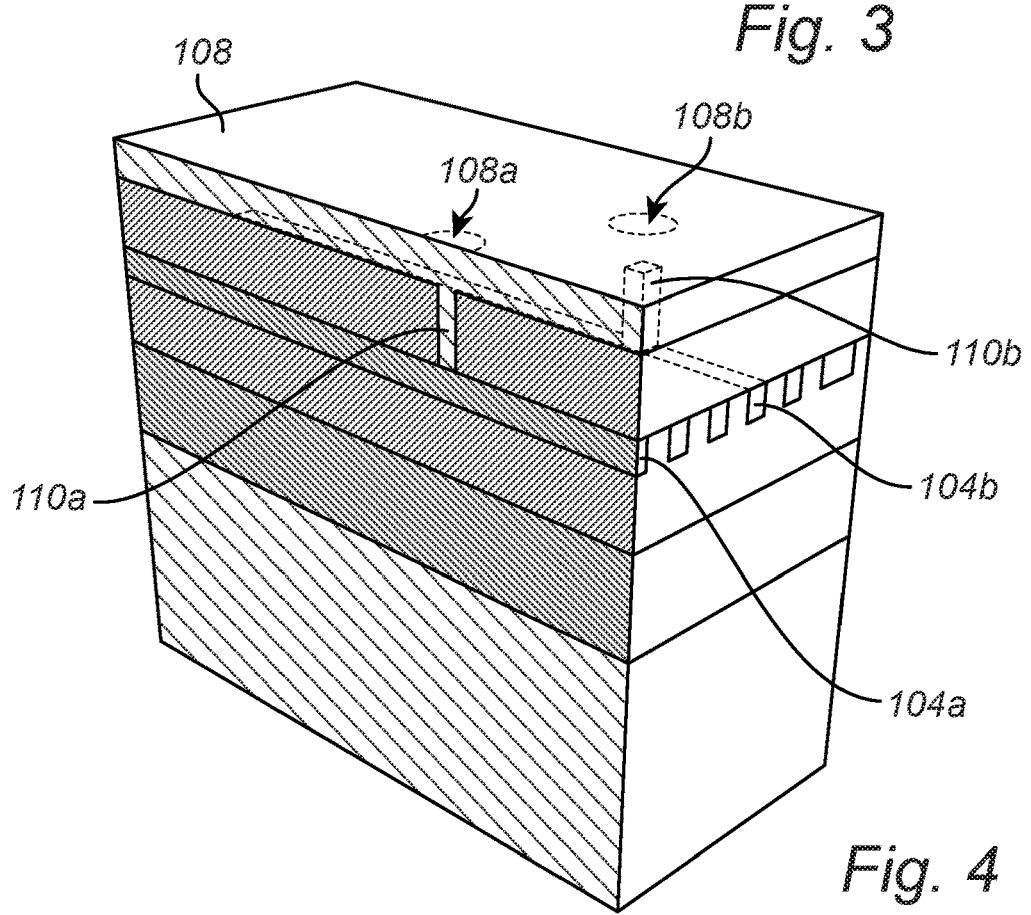
FIG. 4 illustrates a method for forming an interconnection structure and shows a cross-sectional view taken along the line AA indicated in FIG. 2 of an upper surface of a conductive line 104a, 104b of the set of conductive lines 104 of underlying conductive structure.

With reference to FIG. 4, a conductive layer 108 has been formed on the insulating layer 106. The conductive layer 108 may be deposited to cover the insulating layer 106 and fill the set of via holes 106a, 106b. The conductive layer portions filling the via holes 106a, 106b define vertical conductive via structures 110a, 110b. The conductive layer 108 may be formed to present a thickness above an upper surface of the insulating layer 106 corresponding to a desired height of the conductive lines which are to be formed.

The conductive layer 108 may be a metal layer, for instance a layer of ruthenium (Ru). Other examples of the conductive layer include a layer of aluminum (Al), tungsten (W), iridium (Ir), copper (Cu), cobalt (Co), titanium (Ti), gold (Au), silver (Ag) or nickel (Ni). The conductive layer 108 may be deposited by CVD or atomic layer deposition (ALD). The conductive layer 108 may also be deposited by PVD (Physical Vapor Deposition) or electroplated. The conductive layer 108 may be a single metal of the aforementioned materials, or a multilayer combining two or more metals deposited with the same or different deposition methods among the ones just cited.

As will be described in the following, the method comprises forming a first set of mandrel lines 132, a set of spacer lines 138 and a second set of mandrel lines 142 above the conductive layer 108. These sets of lines 132, 138, 142 may be formed by different materials, i.e. a first, a second, and a third material, respectively, selected as materials which may be etched selectively to one another. The first and third material may for instance be different materials selected from carbon-comprising materials and silicon-comprising materials. For instance, the first and third material may be different materials selected from amorphous carbon (or some other organic film material), polysilicon, amorphous silicon or silicon oxide. An amorphous carbon layer or organic film may be deposited for instance by spin-on deposition. A layer of polysilicon, amorphous silicon, or silicon oxide may be deposited for instance by CVD. The second material may be an oxide material or a nitride material. For instance, the second material may be silicon oxide (provided the first or second material is not silicon oxide), titanium oxide, aluminum oxide, aluminum nitride, or silicon nitride. A layer of any of these materials may be deposited for instance by CVD or ALD. By way of example, carbon-based material may be selectively etched with respect to the non-organic material examples using an $O_2$-plasma followed by a rinse. Polysilicon can be selectively etched using a chlorine based dry etch (for instance $Cl_2/O_2$ or $Cl_2/HBr/O_2$). Silicon oxide may be selectively etched with $SF_6$ or $CF_4$.

With reference to FIGS. 5-10, the forming of a first set of mandrel lines 132 on the conductive layer 108 will now be described.

Figure 5:
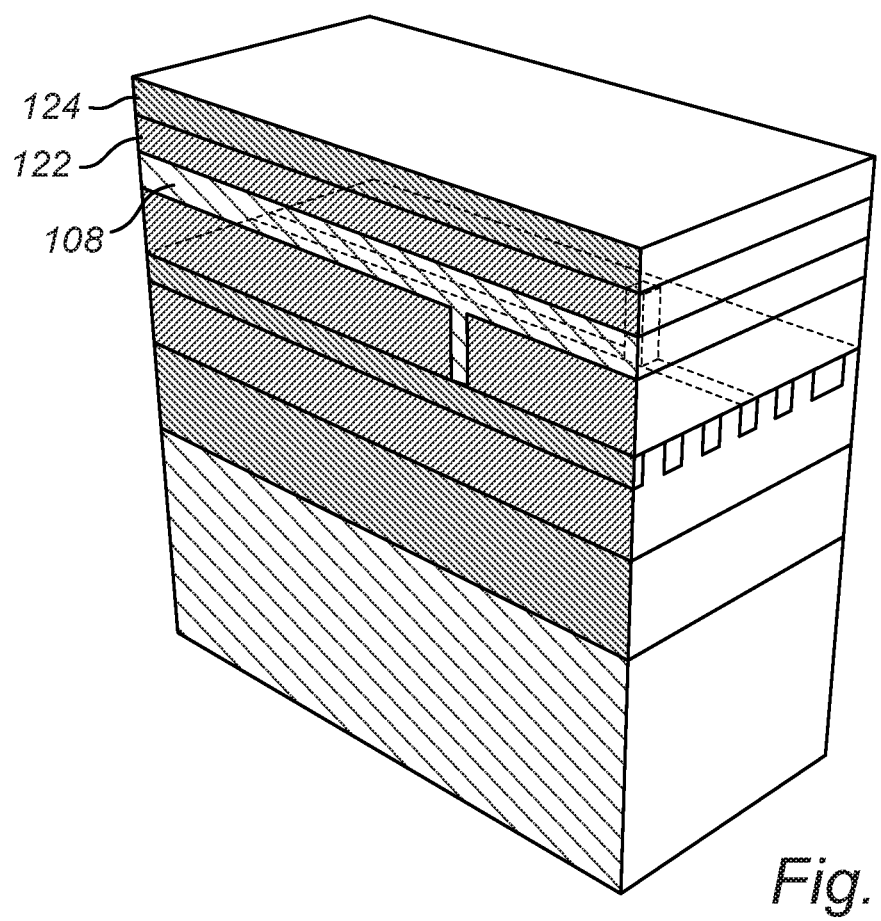
FIG. 5 illustrates a method for forming an interconnection structure and shows a litho stack comprising a photoresist layer 130, a patterning layer 126 and a number of intermediate transfer layers 128 may be formed on the sacrificial mandrel layer 124.

In FIG. 5, a first mandrel layer 122 has been formed on the conductive layer 108. The first mandrel layer 122 may be the layer in which the first set of mandrel lines 132 is to be patterned. The first mandrel layer 122 may accordingly be formed of the first material.

A sacrificial mandrel layer 124 may be formed on the first mandrel layer 122. The sacrificial mandrel layer 124 may be formed of a fourth material, selected from the above first and third material examples, but selected as a material different from the first material. For instance, the first mandrel layer 122 may be formed by a material selected from the carbon-comprising material examples (e.g. amorphous carbon) and the sacrificial mandrel layer 124 may be formed by a material selected from the silicon-comprising material examples (e.g. amorphous silicon), or vice versa.

Figure 6:
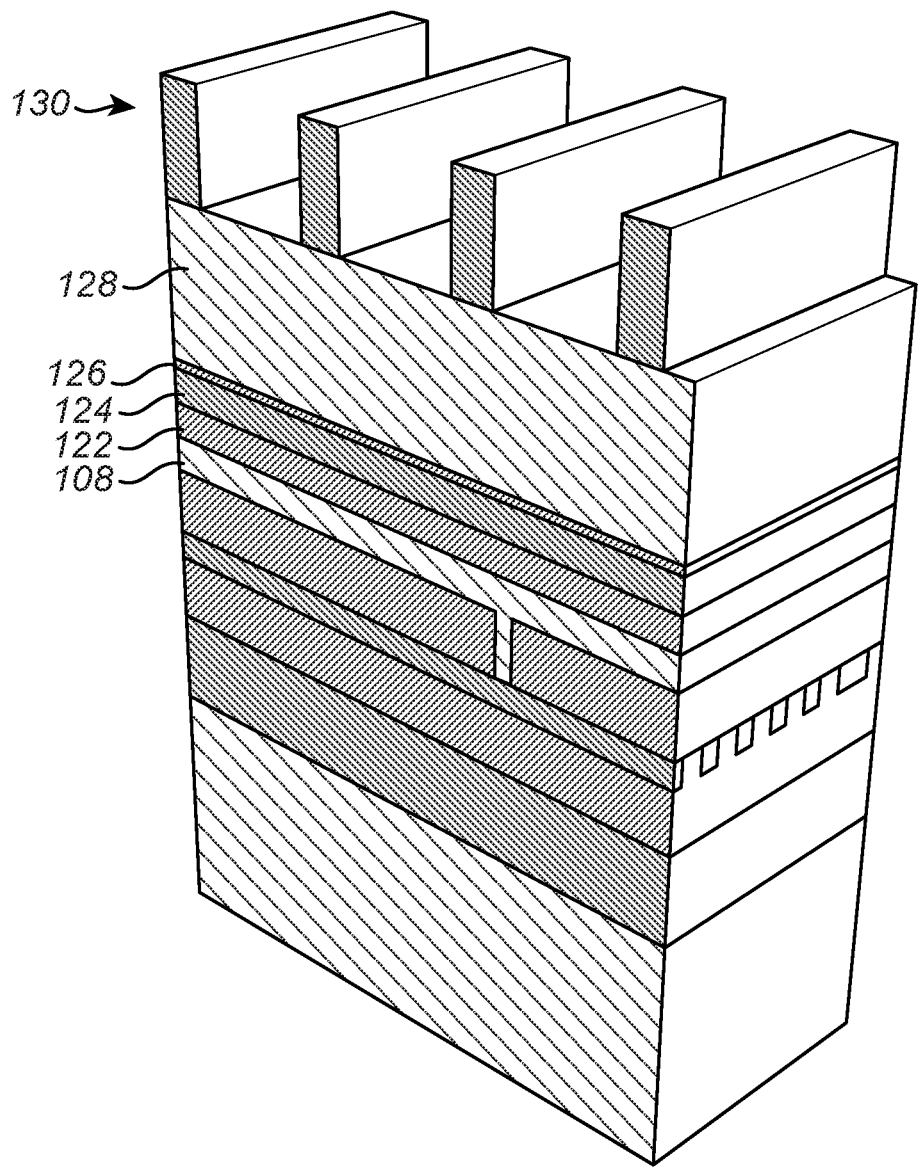
FIG. 6 illustrates a method for forming an interconnection structure and shows a litho stack comprising a photoresist layer 130, a patterning layer 126 and a number of intermediate transfer layers 128 may be formed on the sacrificial mandrel layer 124.
Figure 7:
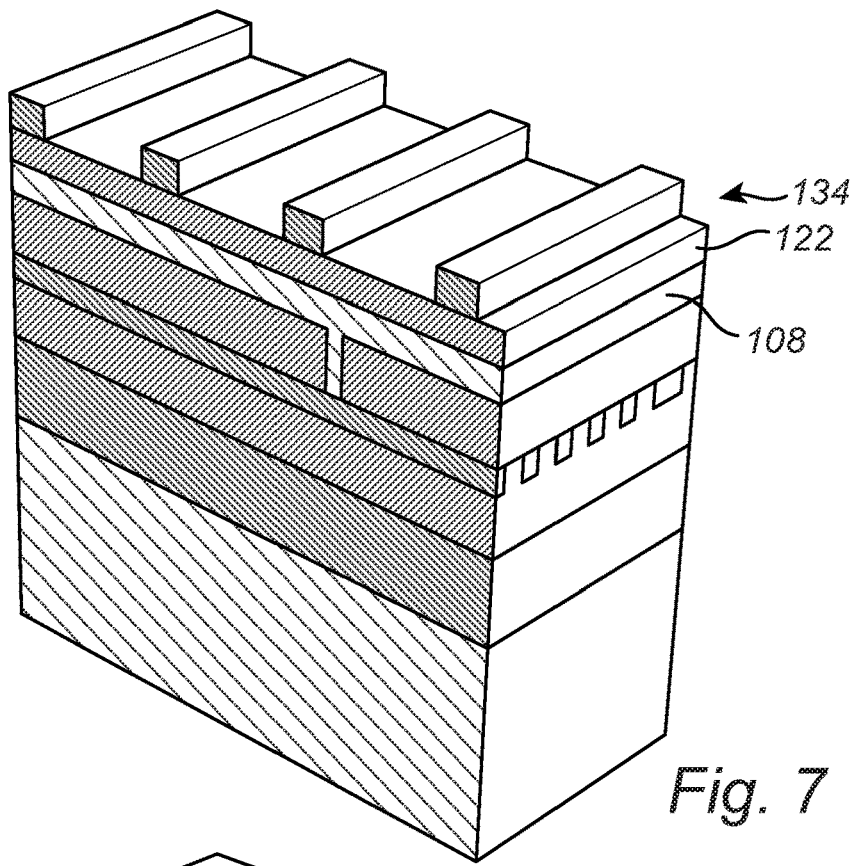
FIG. 7 illustrates a method for forming an interconnection structure and shows the sacrificial mandrel layer 124 may be patterned to form a sacrificial set of mandrel lines 134.

As shown in FIG. 7, the sacrificial mandrel layer 124 may be patterned to form a sacrificial set of mandrel lines 134. The patterning of the sacrificial mandrel layer 124 may comprise a litho-etch sequence, as was described above. For instance, as shown in FIGS. 5 and 6 a litho stack comprising a photoresist layer 130, a patterning layer 126 and a number of intermediate transfer layers 128 may be formed on the sacrificial mandrel layer 124.

Figure 8:
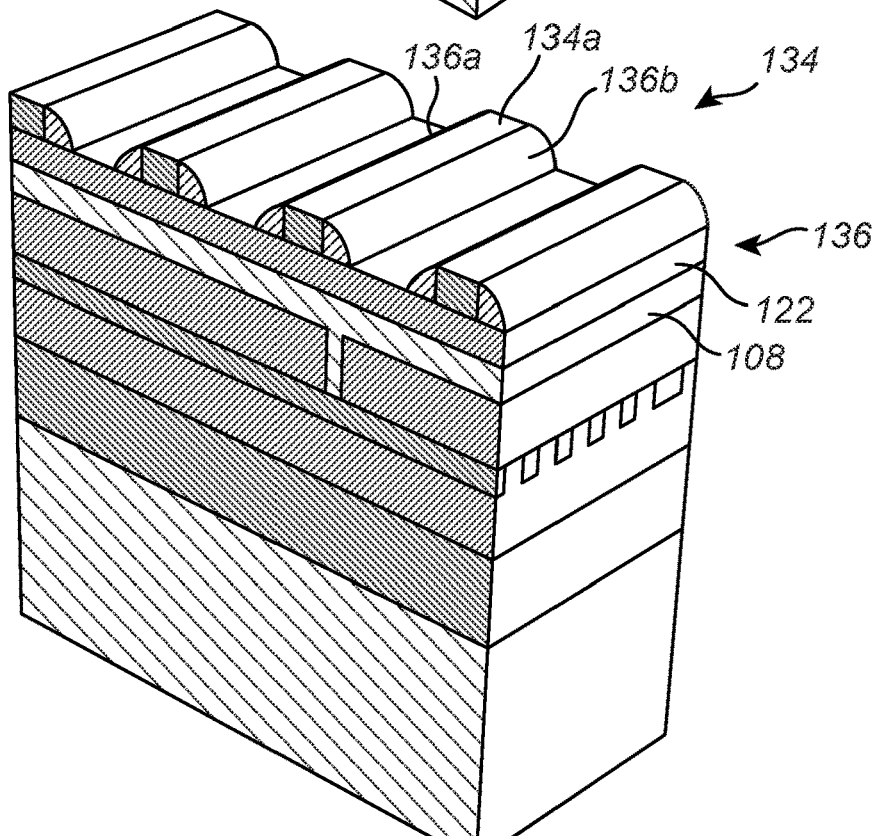
FIG. 8 illustrates a method for forming an interconnection structure and shows a sacrificial set of spacer lines 136 have been formed on the sidewalls of the sacrificial set of mandrel lines 134.

With reference to FIG. 8, a sacrificial set of spacer lines 136 have been formed on the sidewalls of the sacrificial set of mandrel lines 134. As exemplified for the mandrel line 134a, pair of spacer lines 136a, 136b have been formed on opposite sidewalls of each mandrel line 134a. The sacrificial set of spacer lines may be formed by a fifth material, selected for instance from the above listed second material examples. The set of spacer lines 136 may be formed using a sidewall spacer deposition process. A sidewall spacer deposition process may comprise depositing a conformal spacer layer covering the mandrel lines and the surface supporting the mandrel lines (e.g. with reference to FIG. 8 the mandrel lines 134 and the upper surface of the first mandrel layer 122). Conformal layer deposition may be achieved by ALD. The spacer layer may subsequently be subjected to an anisotropic etch adapted to remove spacer layer portions from horizontally oriented surfaces (e.g. with reference to FIG. 8, upper surfaces of the mandrel lines 134 and the upper surface of the first mandrel layer 122) such that spacer lines remain on vertically oriented sidewalls.

Figure 9:
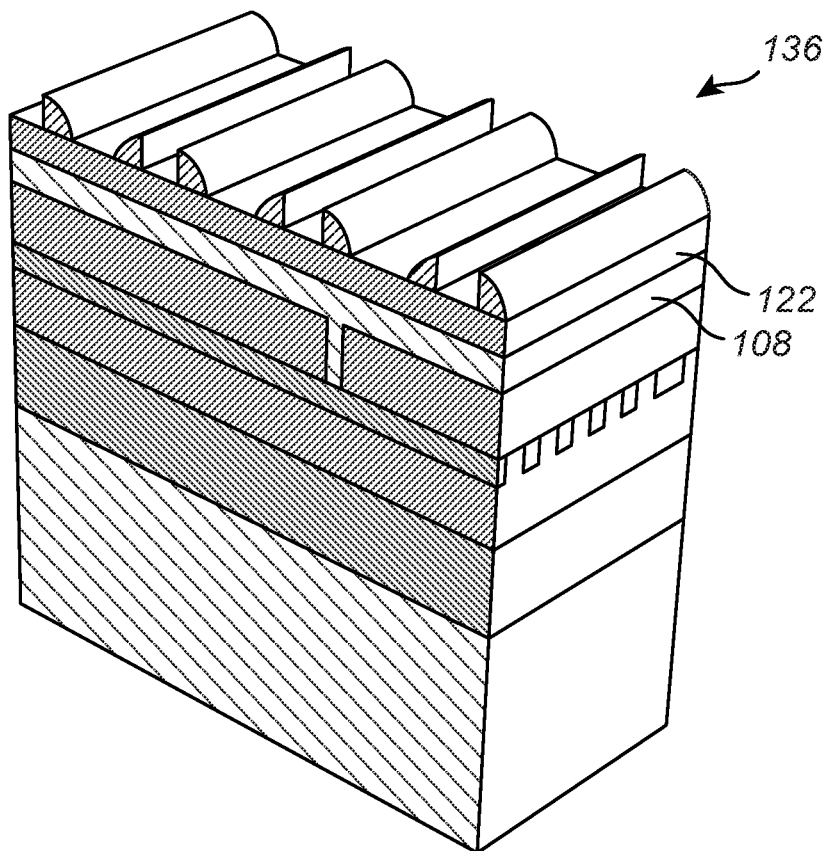
FIG. 9 illustrates a method for forming an interconnection structure and shows the sacrificial mandrel lines 134 having been removed (i.e. "pulled") from the first mandrel layer 122.

With reference to FIG. 9, the sacrificial mandrel lines 134 have been removed (i.e. "pulled") from the first mandrel layer 122. Accordingly, the sacrificial set of spacer lines 136 remain on the first mandrel layer 122. The sacrificial mandrel lines 134 may be removed by etching the sacrificial mandrel lines 134 selectively to the sacrificial set of spacer lines 136 and the first mandrel layer 122. For instance, any of the above listed etching processes may be used suitable for the material selection in question.

Figure 10:
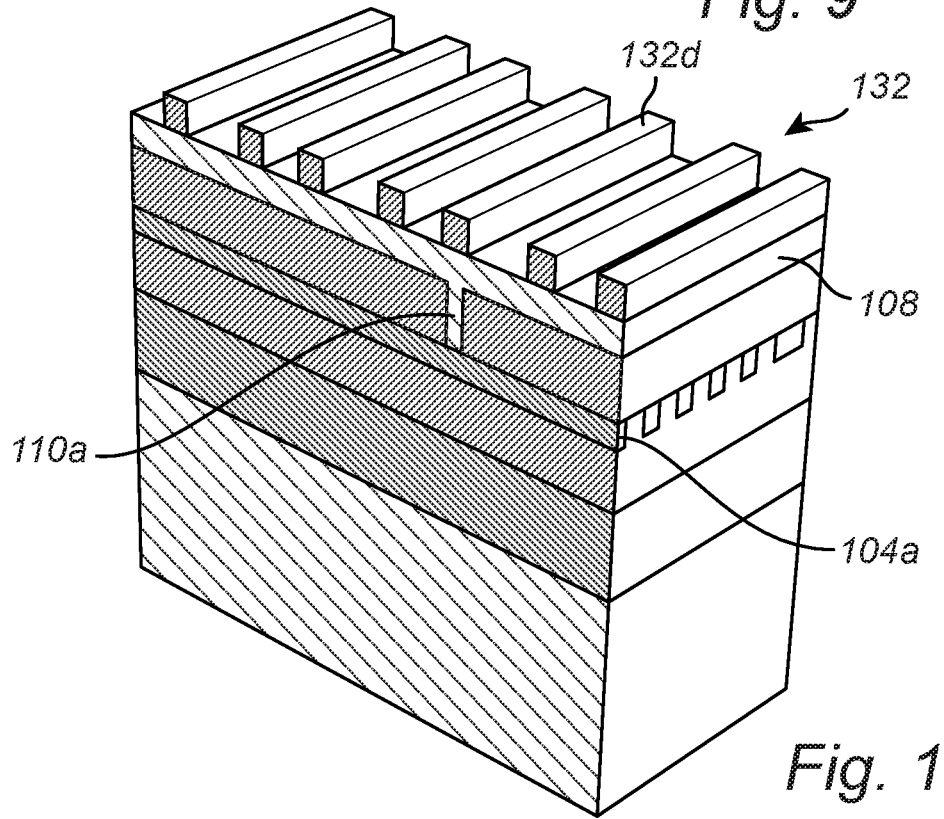
FIG. 10 illustrates a method for forming an interconnection structure and shows a first set of mandrel lines 132 formed on the conductive layer 108.

Subsequent to the removal of the sacrificial mandrel lines 134, the first mandrel layer 122 may be patterned using the sacrificial set of spacer lines 136 as an etch mask. The first set of mandrel lines 132 may accordingly be formed by first mandrel layer portions preserved under the upper set of spacer lines 136. The resulting first set of mandrel lines 132 formed on the conductive layer 108 is shown in FIG. 10.

By a spacer-assisted patterning of the first mandrel layer 122, a minimum pitch of the first set of mandrel lines 132 corresponding to half the pitch of the sacrificial set of mandrel lines 134 may be achieved. However, it may also be possible to form the first set of mandrel lines 132 using a litho-etch sequence, as set out above, using a photoresist layer with a lithographically defined line pattern. For instance, extreme ultraviolet lithography (EUVL) may be used to define a tight pitch pattern in a photoresist layer.

Regardless of the process employed for forming the first set of mandrel lines 132, the set of mandrel lines 132 may be formed to extend in parallel to the horizontal direction Y. The set of mandrel lines 132 may further be formed with a uniform spacing and uniform line width.

The first set of mandrel lines 132 may further be formed with a desired alignment with respect to the underlying conductive structures, in the illustrated case with respect to the conductive lines of the lower interconnection level 100. Accordingly, a mandrel line 132d of the first set of mandrel lines 132 may be formed at a location (i.e. along the horizontal direction X) such that the mandrel line 132d extends across the conductive via 110a This allows a conductive line of the set of conductive lines which is to be formed to be connected to an underlying conductive structure (in the illustrated case the conductive line 104a) by the conductive via 110a.

As schematically indicated in FIG. 4, the presence of the via holes 106a, 106b in the insulating layer 106 may cause an upper surface of the deposited conductive layer 108 to present a varying topography in a first region 108a above the first via hole 106a. Corresponding regions of varying topography may be present above each respective via hole, such as region 108b above the second via hole 106b. To facilitate alignment of the first set of mandrel lines 132 with the underlying via pattern, the regions of varying topography may be used as alignment markers for the alignment of the structure within patterning tool, such as the lithographic scanner used for patterning the photoresist layer 130 in FIG. 6.

The regions off varying topography 108a, 108b may be used in combination with, or as an alternative to, a FRAME area defined along a periphery of the substrate, or along a saw lane of the substrate. The FRAME area may comprise alignment and metrology structures and process control monitors. If a FRAME area is defined, the conductive layer 108 may be opened in a region above the FRAME area prior to the deposition of the first mandrel layer 122. The structures in the FRAME area may thereby be exposed underneath the otherwise typically opaque conductive layer 108.

Figure 11:
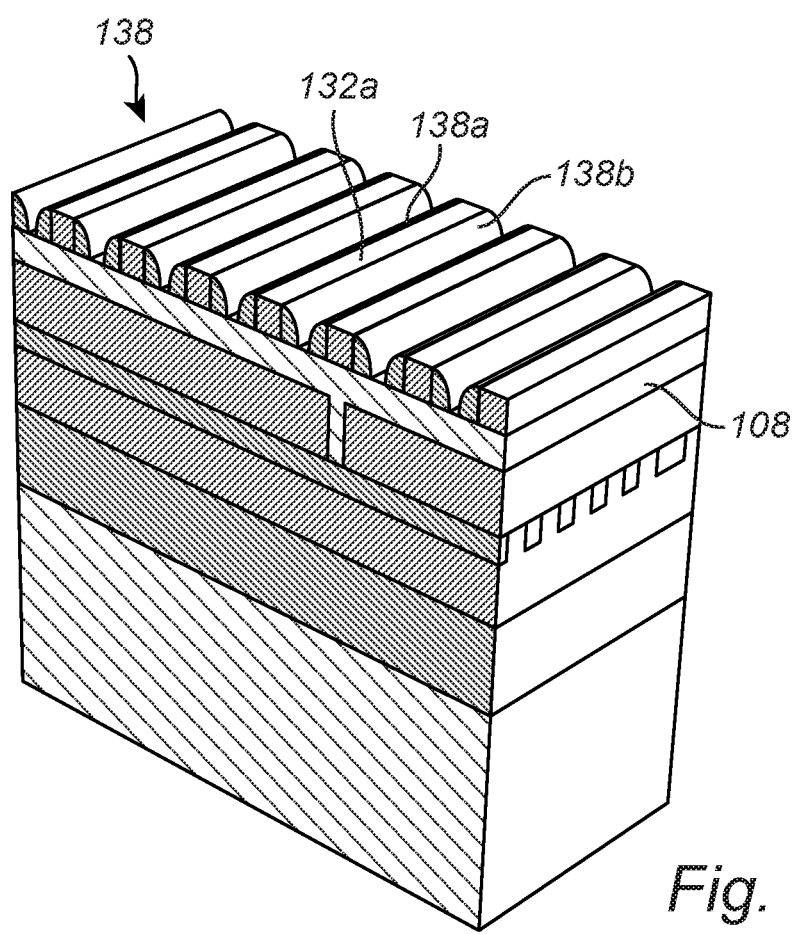
FIG. 11 illustrates a method for forming an interconnection structure and shows the set of spacer lines 138 having been formed on sidewalls of the first set of mandrel lines 132.

In FIG. 11, the set of spacer lines 138 have been formed on sidewalls of the first set of mandrel lines 132. As exemplified for the mandrel line 132a, a pair of spacer lines 138a, 138b have been formed on opposite sidewalls of each mandrel line 132. The set of spacer lines 138 is, as mentioned above, formed of the second material. The set of spacer lines 138 may be formed using a sidewall spacer deposition process, similar to what was described above in connection with the set of spacer lines 136 (i.e. comprising conformal spacer layer deposition and a vertical etch of the conformal spacer layer). The spacer lines 138 may be formed with a line width (i.e. the dimension along the first horizontal direction X, determined by the thickness of the conformal spacer layer) such that gaps may be defined between spacer lines formed on adjacent mandrel lines of the first set of mandrel lines 132. The width of the gaps may advantageously correspond or match the line width of the first set of mandrel lines 132. As an example, a line spacing of the first set of mandrel lines 132 may be three times the line width W of the first set of mandrel lines 132 (equivalent to a line pitch of four times W). Forming the spacer lines 138 with a line width W may accordingly result in gaps with a width W. This in turn enables forming the second set of mandrel lines 142 with a same line width Was the first set of mandrel lines 132.

Figure 12:
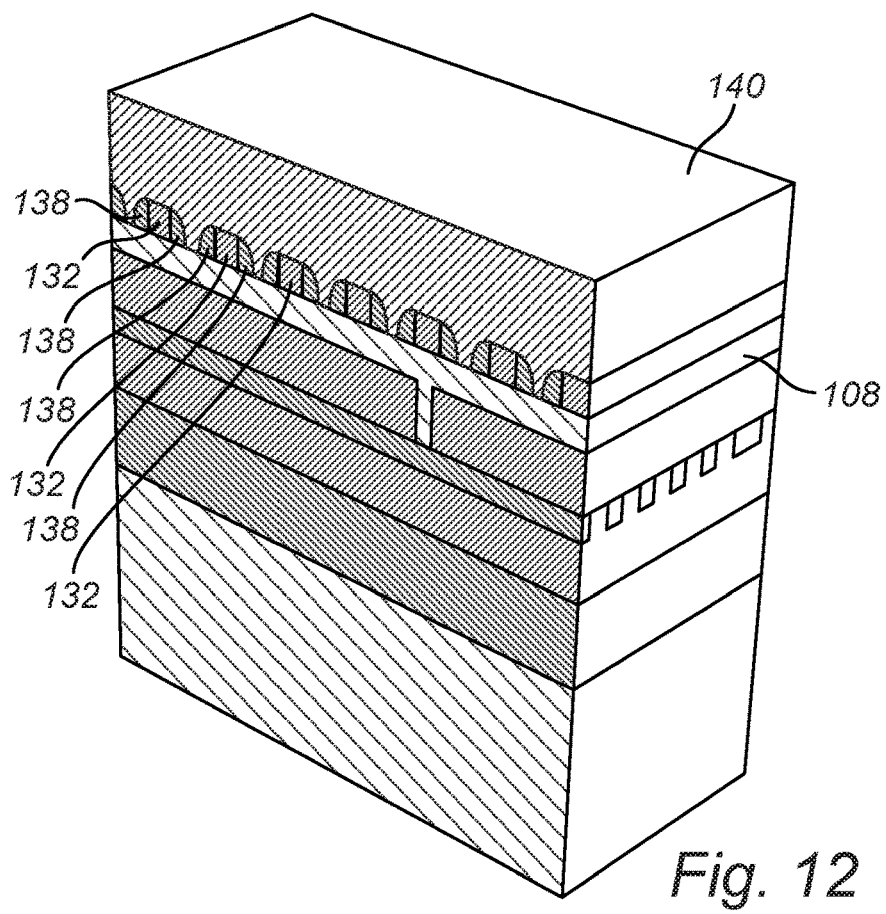
FIG. 12 illustrates a method for forming an interconnection structure and shows a second mandrel layer 140 has been formed to cover the first set of mandrel lines 132 and the set of spacer lines 138.
Figure 13:
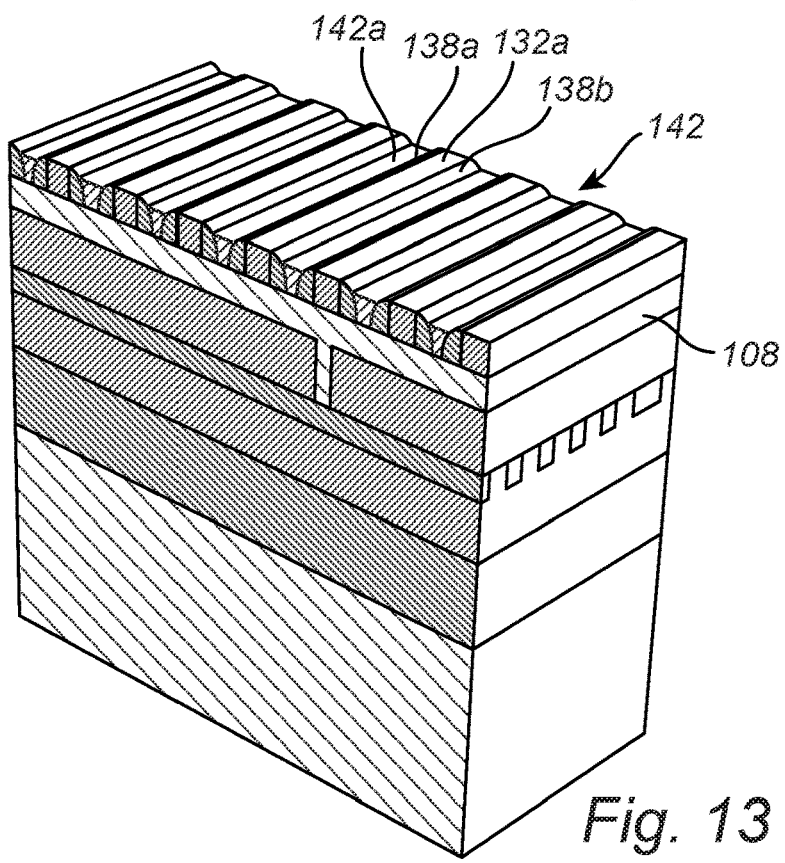
FIG. 13 illustrates a method for forming an interconnection structure and shows a thickness of the second mandrel layer 140 has been reduced such that separate second mandrel lines 142, filling the gaps between the spacer lines 138 have formed.

FIGS. 12 and 13 show forming of the second set of mandrel lines 142 on the conductive layer 108. More specifically, the second set of mandrel lines 142 may be formed in the gaps between the spacer lines 138. The second set of mandrel lines 142 is, as mentioned above, formed of the third material.

With reference to FIG. 12, a second mandrel layer 140 has been formed to cover the first set of mandrel lines 132 and the set of spacer lines 138. The second mandrel layer 140 fills the gaps between the spacer lines 138.

In FIG. 13, a thickness of the second mandrel layer 140 has been reduced such that separate second mandrel lines 142, filling the gaps between the spacer lines 138 have formed The thickness reduction may be achieved by etch back, optionally combined with an initial chemical mechanical polishing (CMP) of an upper surface of the second mandrel layer 140.

As exemplified for the mandrel line 132a, a pair of spacer lines 138a, 138b may be formed on opposite sidewalls of each mandrel line 132a and a mandrel line 142a of the second set may be formed adjacent to each spacer line 138a. Accordingly, denoting the first set of mandrel lines 132 "A", the spacer lines 138 "B" and the second set of mandrel lines 142 "C", the pattern in FIG. 13 may be defined as a repeating pattern of "CBAB".

The spacing of the first set of mandrel lines 132, and the linewidth of the spacer lines 138 may be defined such that the gaps may be defined at a location (i.e. along the horizontal direction X) such that a mandrel line of the second set of mandrel lines 142 may extend across the second via hole 106b (and accordingly across the conductive via 110b therein). This allows a conductive line of the set of conductive lines which is to be formed to be connected to an underlying conductive structure by a conductive via (such as to the conductive line 104b by the conductive via 110b in the via hole 106b visible in FIG. 4).

FIG. 14 show a cross section of the structure, still along the line AA as indicated in the inset, subsequent to a line cutting operation. FIG. 15 shows an enlarged view of the cross section. In FIGS. 14 and 15 a number of mandrel lines of the second set of mandrel lines 142 (exemplified by the mandrel line 142a) have been cut into line segments 142aa and 142ab (both line segments are visible in FIG. 17). The two line segments 142aa and 142ab may be separated by a gap. The gap exposes an upper surface portion of the conductive layer 108, between the two line segments 142aa, 142ab.

Figure 16:
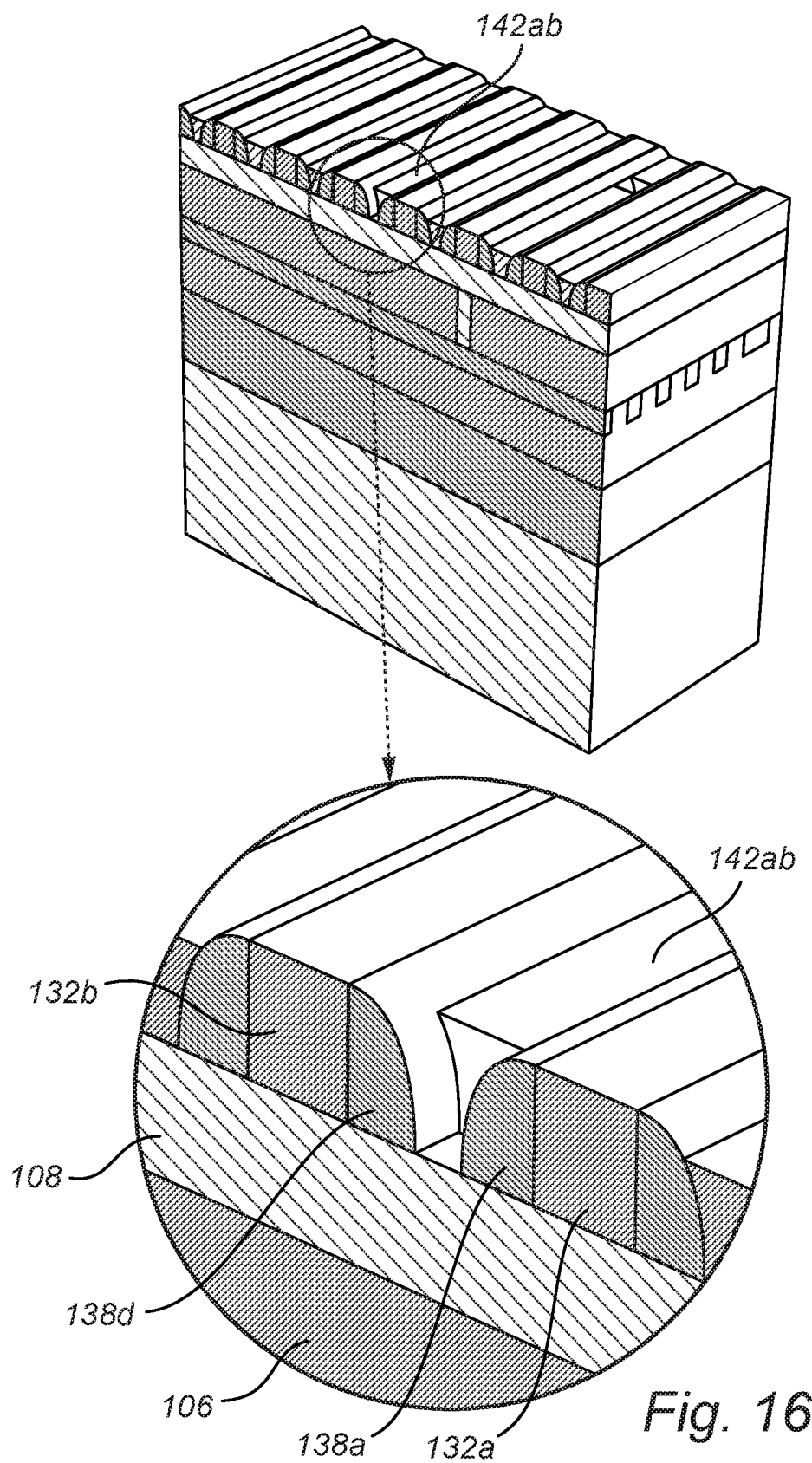
FIG. 16 illustrates a method for forming an interconnection structure and shows the resulting cut mask 144 being removed subsequent to cutting the selected intended mandrel lines of the second set of mandrel lines 142.
Figure 17:
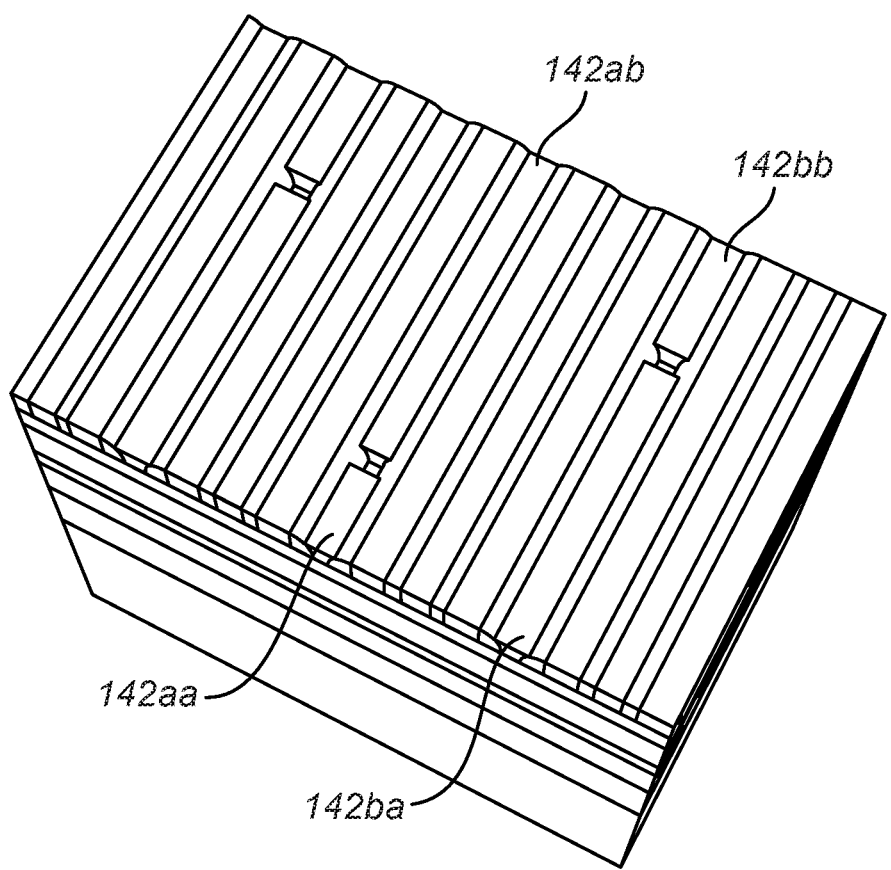
FIG. 17 illustrates a method for forming an interconnection structure and shows the resulting cut mask 144 being removed subsequent to cutting the selected intended mandrel lines of the second set of mandrel lines 142.

The cutting of the mandrel line 142a may comprise forming a cut mask 144 above the first and second mandrel lines 132, 142 and spacer lines 138. The cut mask may comprise a cut mask layer with a cut opening 144a patterned therein. As may be derived from the enlarged view of FIG. 15, the opening 144a exposes a portion of the mandrel line 142a. The opening 144a may be formed with a width greater than a line width of the mandrel line 142a. Accordingly, the opening 144a may expose a portion of the spacer lines 138a and 138d formed on the adjacent mandrel lines 132a, 132b, and even one or both of said adjacent mandrel lines 132, 132b. The mandrel line 142a may be cut by removing the exposed portion of the mandrel line 142a by etching through the opening 144a. Since the mandrel line 142a may be formed of the third material which may be different from the first and second materials, the etching may selectively etch the mandrel line 142a with respect to spacer lines (such as 138a, 138d) and first mandrel lines (such as 132a, 132b) exposed in the cut opening 144a. Accordingly, as shown in FIG. 15 the exposed portions of the mandrel line 132b and the spacer lines 138a, 138d may be preserved following the etching. Thereby the mandrel line 142a of the second set of mandrel lines 142 may be cut into two separate mandrel line segments. As indicated in FIG. 14, a number of cut openings 144a, 144b may be defined in the cut mask layer 144. Accordingly, a number of mandrel lines of the second set of mandrel lines 142 may be cut in parallel, Subsequent to cutting the selected intended mandrel lines of the second set of mandrel lines 142, the cut mask 144 may be removed. The resulting structure is shown in FIGS. 16 and 17, comprising among others the segmented lines 142aa, 142ab and 142ba, 142bb.

Optionally, a cut opening, such as the cut opening 144a, may be formed with a width such that the opening exposes a number of mandrel lines of the second set of mandrel lines 142. For instance, the cut opening may be formed to be elongated along the first horizontal direction X and accordingly extend above/across a number of mandrel lines of the second set of mandrel lines 142. By etching through such an elongated cut opening, each one of the mandrel lines of the second set of mandrel lines 142 exposed partially by the elongated cut opening may be cut simultaneously without cutting any first mandrel lines 132 or spacer lines 138 exposed by the elongated cut opening.

The cut mask 144 may for instance be formed by a sixth material, different from the first through third materials. The cut mask 144 may for instance be a multilayer litho stack composed of an amorphous carbon, a silicon oxy-nitride (SiON) hard mask, a BARC and a resist. The cut mask 144 may be formed by depositing a cut mask layer covering the first and second sets of mandrel lines 132, 142 and the set of spacer lines 138. Cut openings 144a, 144b may thereafter be patterned in the cut mask layer in a litho-etch sequence, as set out above, comprising using a photoresist layer with a lithographically defined cut pattern.

Figure 18:
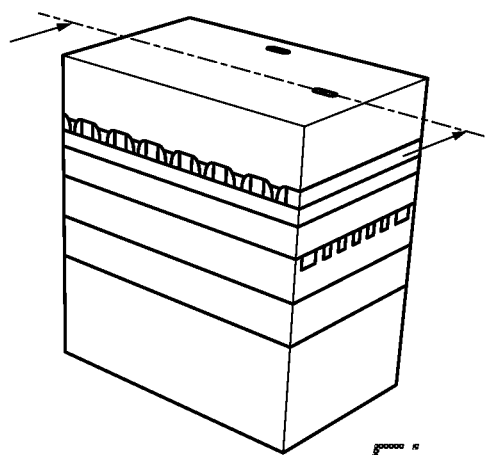
FIG. 18 illustrates a method for forming an interconnection structure and shows line BB in the device.
Figure 19:
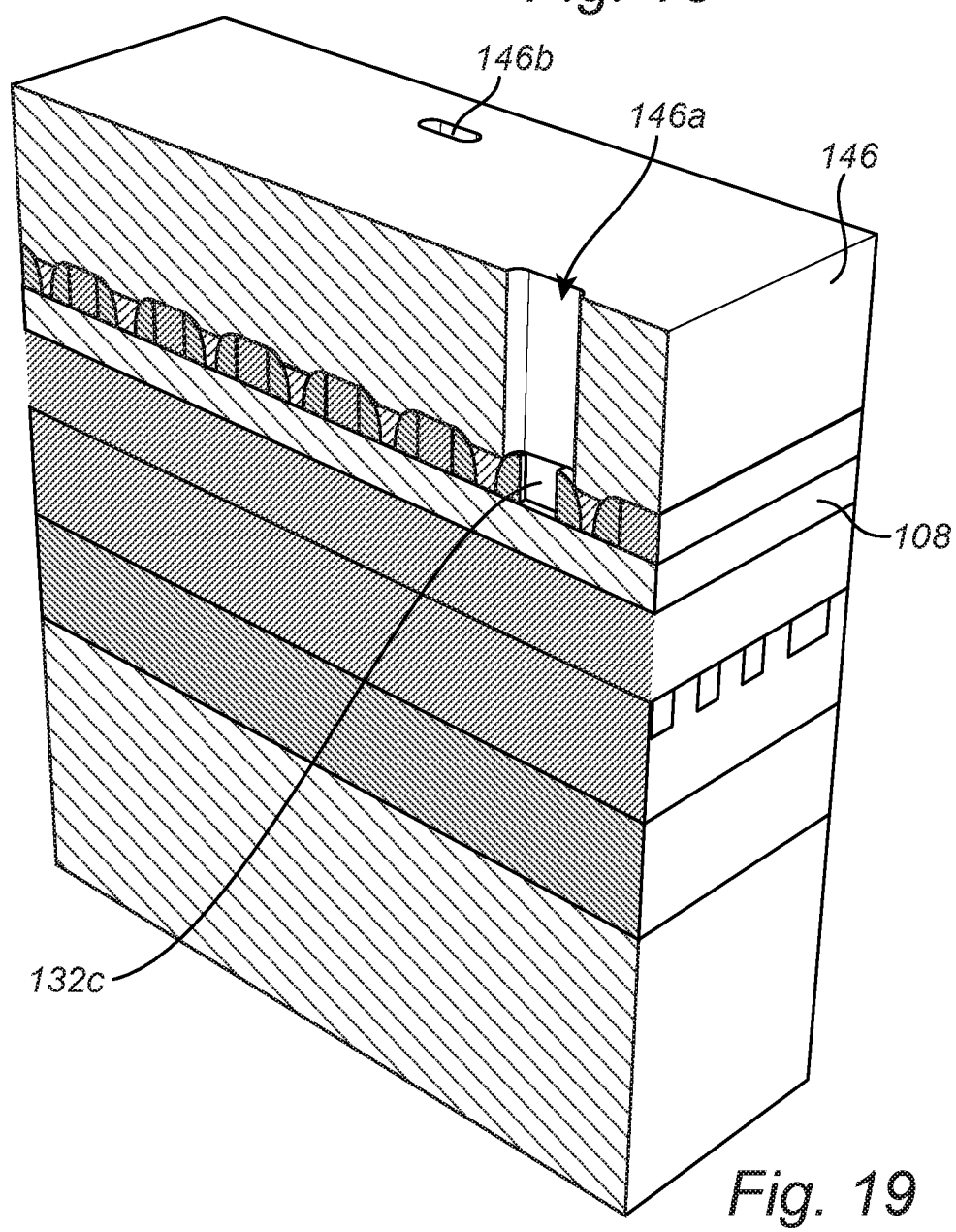
FIG. 19 illustrates a method for forming an interconnection structure and shows a cross section of the structure taken along the line BB indicated in FIG. 18 and further shows a number of mandrel lines of the first set of mandrel lines 132 (exemplified by the mandrel line 132c) have been cut into two line segments 132ca and 132cb.
Figure 20:
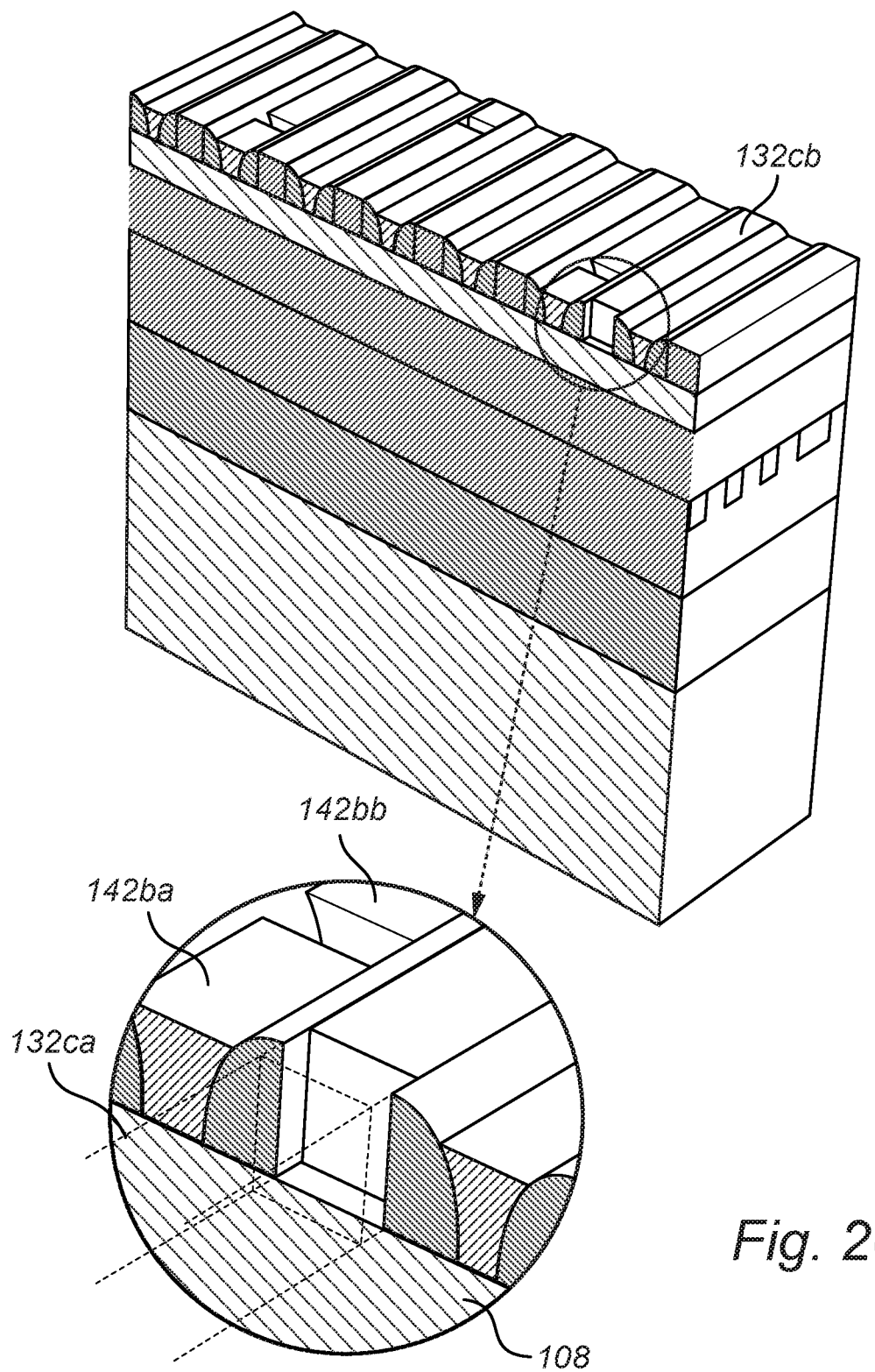
FIG. 20 illustrates a method for forming an interconnection structure and shows line segments 132ca and 132cb.

FIG. 19 show a cross section of the structure taken along the line BB indicated in FIG. 18. In FIG. 19 a number of mandrel lines of the first set of mandrel lines 132 (exemplified by the mandrel line 132c) have been cut into two line segments 132ca and 132cb (both line segments are visible in FIG. 20). The two line segments 132ca and 132cb may be separated by a gap. The gap exposes an upper surface portion of the conductive layer 108, between the two line segments 132ca, 132cb. The process of cutting mandrel lines of the first set of mandrel lines 132 may proceed in a manner analogous to the process of cutting mandrel lines of the second set of mandrel lines 142, as described above. Accordingly, the cutting may comprise etching mandrel lines of the first set of mandrel lines 132 exposed by cut openings 146a, 146b in a cut mask 146. The cut mask 146 may be formed in a same manner and by a same material as the cut mask 144. Since the mandrel line 132c may be formed of the first material which may be different from the second and third materials, the etching may selectively etch the mandrel line 132c with respect to any spacer lines of the set 138 and any mandrel lines of the second set of mandrel lines 142 exposed in the cut openings 146a, 146b. Optionally, a cut opening, such as the cut opening 146a, may be elongated along the horizontal direction X such that the opening exposes a number of mandrel lines of the first set of mandrel lines 132, thereby enabling simultaneous selective cutting of a number of mandrel lines of the first set of mandrel lines 132.

Figure 21:
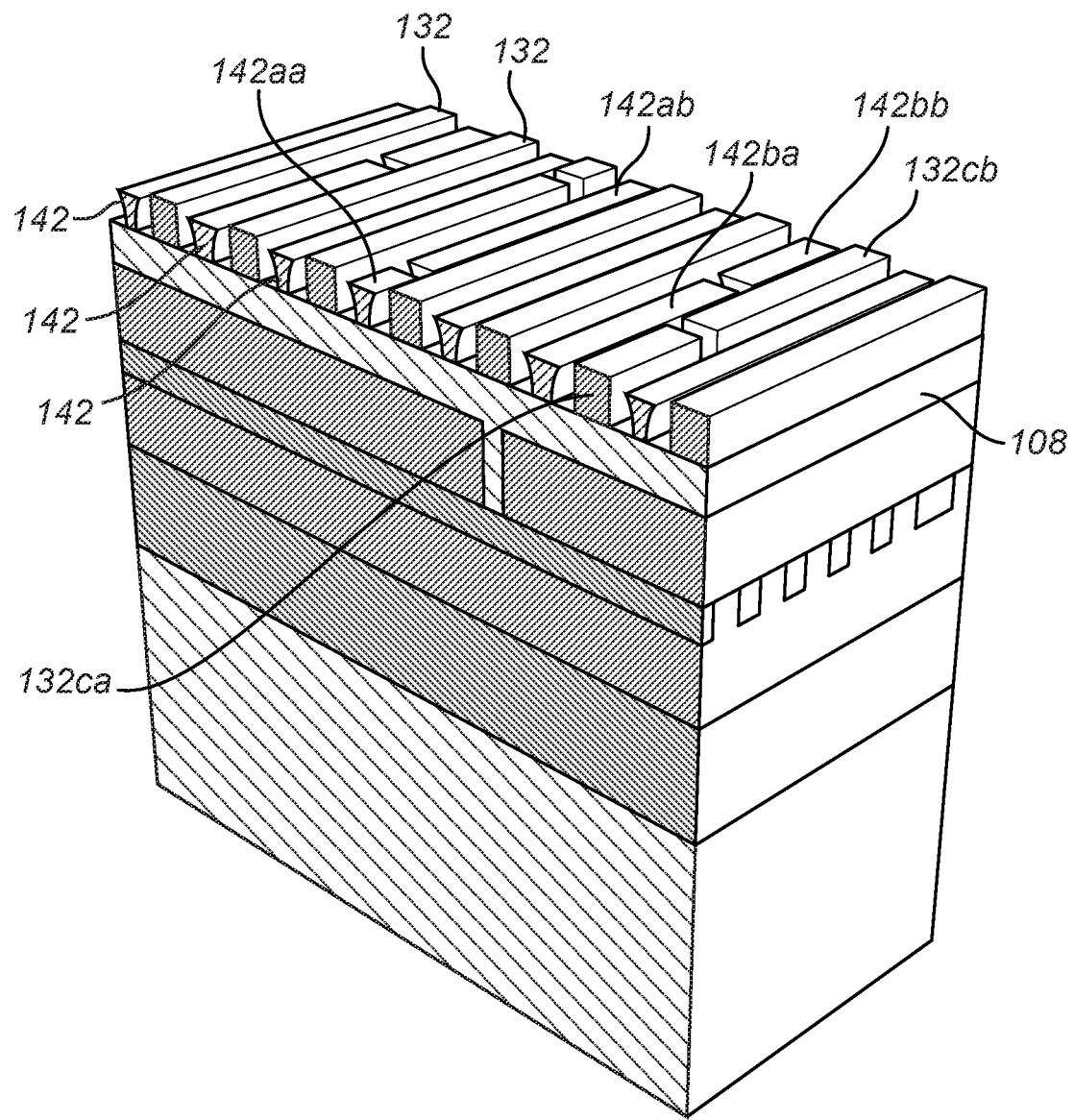
FIG. 21 illustrates a method for forming an interconnection structure and again shows the structure along the line AA.

FIG. 21 again shows the structure along the line AA. In FIG. 21 the set of spacer lines 138 have been removed, selectively with respect to the first and second sets of mandrel lines 132, 142. Thereby an alternating pattern of mandrel lines of the first set 132 and mandrel lines of the second set 142 remain on the conductive layer 108 (i.e. a repetitive pattern of "AC", where A and C may be spaced apart by gaps of uniform width). The spacer lines 138 may be removed using an etching process which etches the second material selectively to the first and third material.

Figure 22:
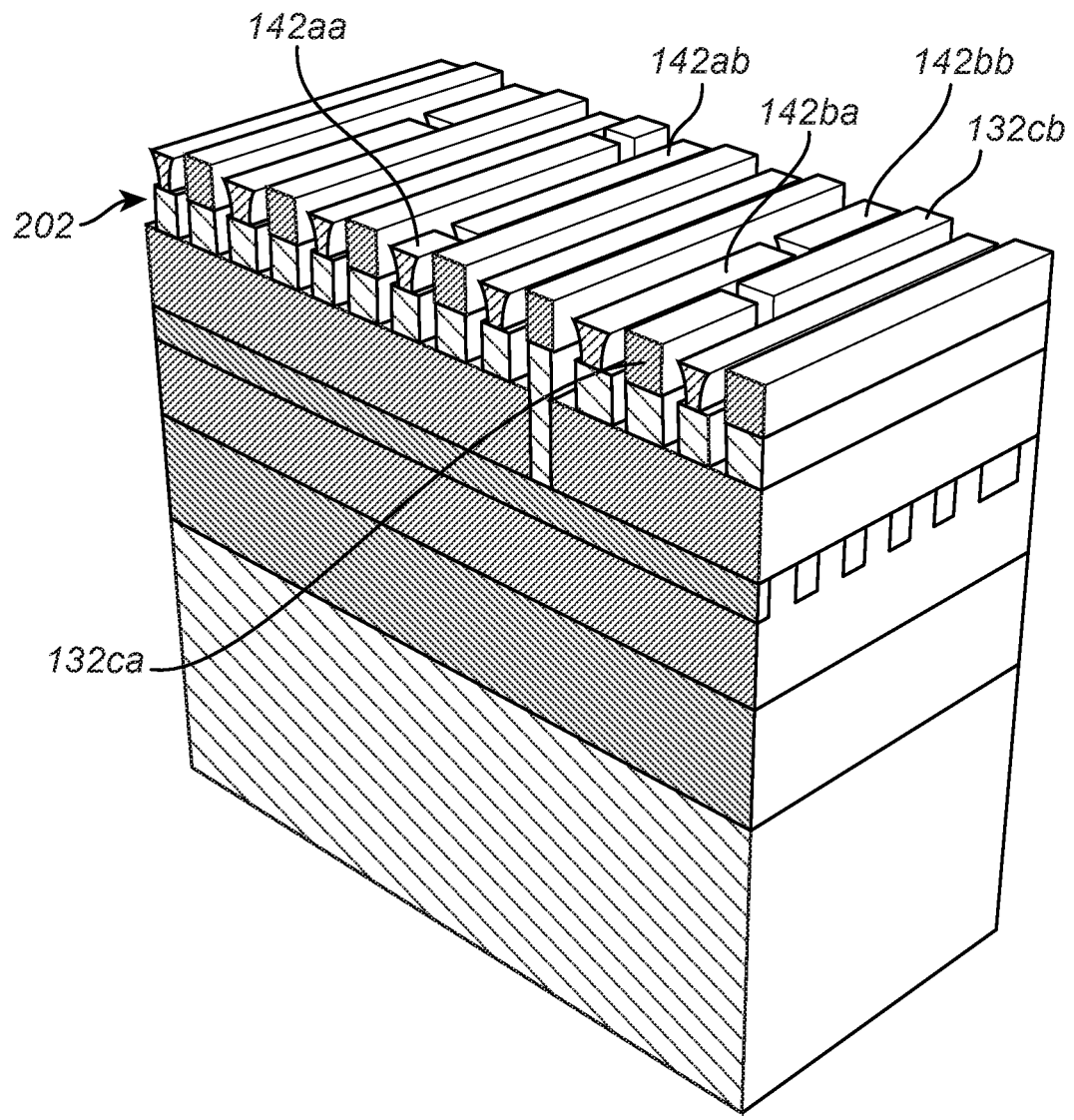
FIG. 22 illustrates a method for forming an interconnection structure and shows the conductive layer 108 has been patterned to form a set of conductive lines 202.

In FIG. 22, the conductive layer 108 has been patterned to form a set of conductive lines 202. The conductive layer 108 may be etched while using the alternating pattern of mandrel lines 132, 142 as an etch mask. The conductive lines 202 have accordingly been formed by "printing" the alternating pattern of mandrel lines 132, 142 into the conductive layer 108 in a direct conductive layer etch, Each conductive line of the set of conductive lines 202 may be formed by a respective conductive layer portion preserved under a mandrel line of either the first set or second set of mandrel lines 132, 142. The spacer lines define the spacing of the conductive lines 202. The gaps between cut mandrel lines (for instance between mandrel line segments 142aa and 142ab, 142ba and 142bb, 132ca and 132cb) may be transferred to corresponding gaps along the conductive lines 202. The conductive layer 108 may for instance be etched using a Reactive Ion Etch process making use of $O_2$ plasma or some other conventional etching process enabling high fidelity pattern transfer into a metal layer.

Figure 23:
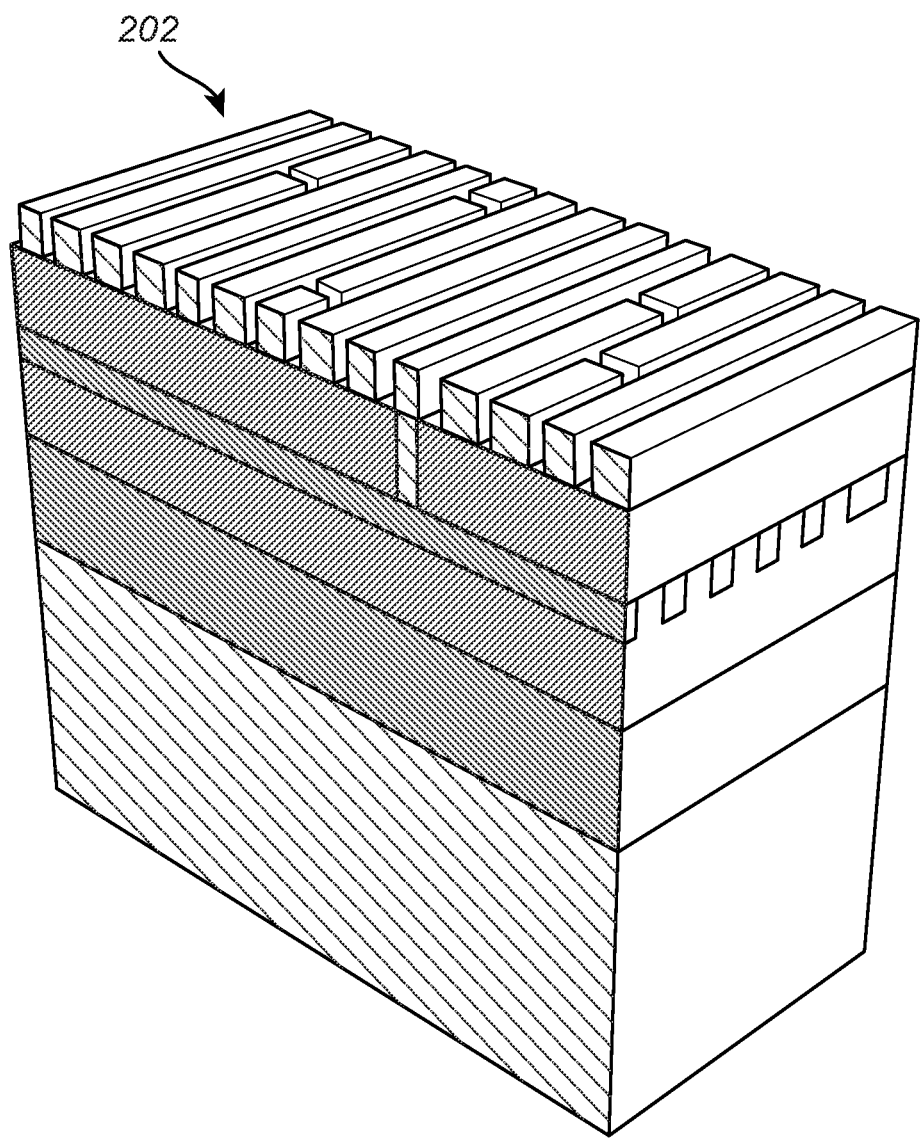
FIG. 23 illustrates a method for forming an interconnection structure and shows the first and second sets of mandrel lines 132, 142 have been removed from the conductive lines 202.
Figure 24:
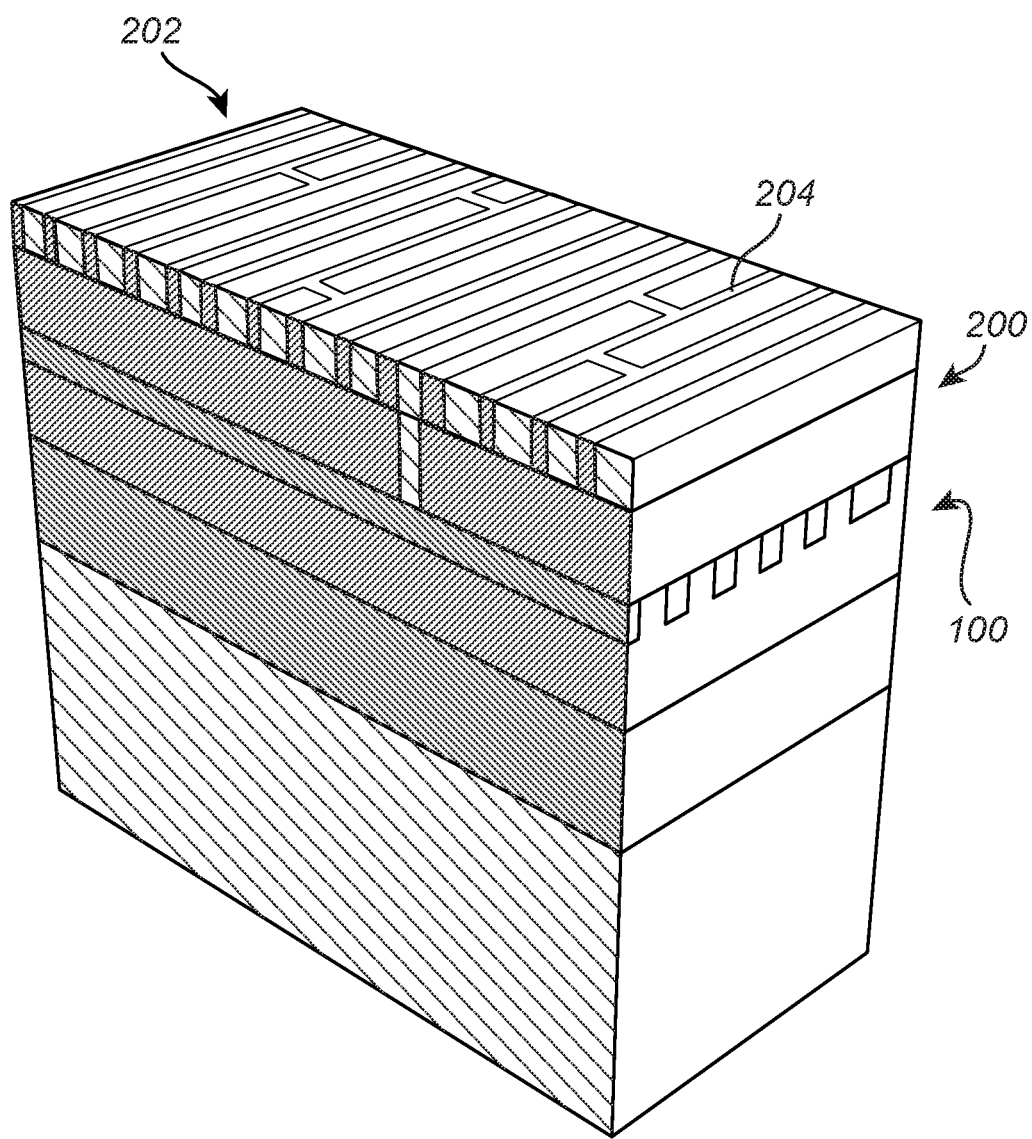
FIG. 24 illustrates a method for forming an interconnection structure and shows a further insulating layer 204 has been formed to cover the insulating layer 106 and embed the set of conductive lines 202.

In FIG. 23, the first and second sets of mandrel lines 132, 142 have been removed from the conductive lines 202, In FIG. 24, a further insulating layer 204 has been formed to cover the insulating layer 106 and embed the set of conductive lines 202. The insulating layer 204 may be of a same material as the insulating layer 106. The insulating layer 204 may for instance be a CVD deposited low-k dielectric layer. Following deposition, the deposited insulating layer may be etched back and/or subjected to CMP such that upper surfaces of the conductive lines 202 may be exposed. The insulating layers 106 and 204 may together form part of a dielectric layer or layer stack of a second interconnection level 200 formed on the first interconnection level 100. Interface layers and capping layers may subsequently be deposited on the conductive lines 202 and the insulating layer 204.

Optionally, further interconnection levels may thereafter be formed by repeating the method, or using conventional dual damascene processing, depending on desired aggressiveness of pitch, In the above the disclosure has mainly been described with reference to a limited number of examples. However, as is readily appreciated by a person skilled in the art, other examples than the ones disclosed above may be equally possible within the scope of the disclosure, as defined by the appended claims. For instance, although in the above described method cutting of mandrel lines of the second set of mandrel lines 142 was performed prior to cutting of mandrel lines of the first set of mandrel lines 132, the opposite order is equally possible. Moreover, in case cutting of only every other line is needed, the cutting of mandrel lines of either the first or second set of mandrel lines 132, 142 may be omitted.

Figure 25:
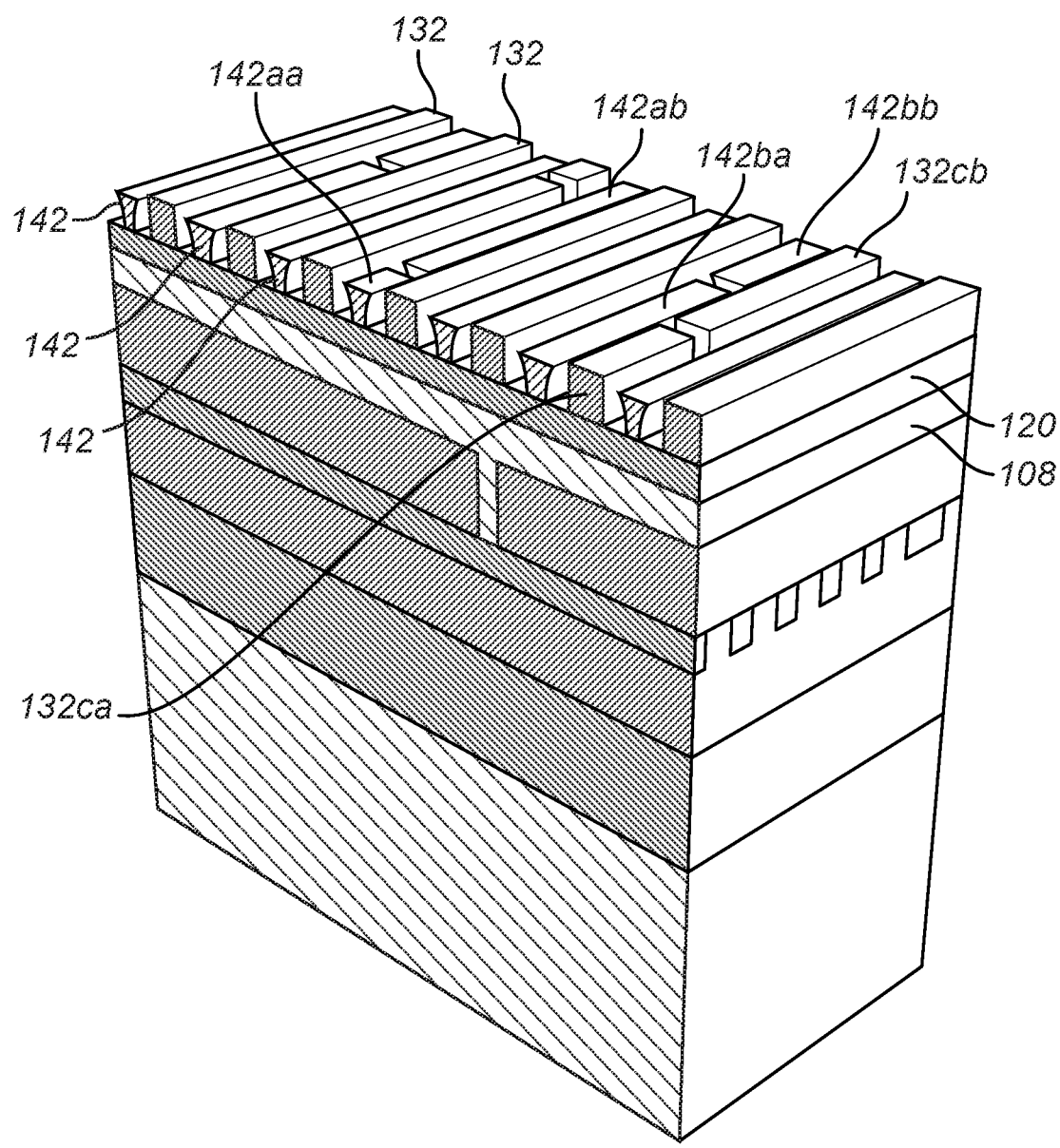
FIG. 25 illustrates an alternative approach for patterning a conductive layer and shows a further variation to the method comprising direct etching of the conductive layer 108 using the alternating pattern of mandrel lines 132, 142 as an etch mask.

FIG. 25 shows a further variation to the above shown method comprising direct etching of the conductive layer 108 using the alternating pattern of mandrel lines 132, 142 as an etch mask. According to the alternative approach, the conductive layer 108 may be covered by an intermediate layer 120. The intermediate layer 120 may for instance be a hard mask layer, such as TiN. The intermediate layer 120 may first be patterned by etching while using the alternating pattern of mandrel lines 132, 142 as an etch mask. The conductive layer 108 may thereafter be patterned while using at least the patterned intermediate layer 120 as an etch mask. Subsequent to patterning the conductive layer 108 the patterned intermediate layer 120 may be removed and the method may then proceed as described above in connection with FIG. 24.

The invention claimed is:

1. A method for forming an interconnection structure for a semiconductor device, the method comprising:
  forming a conductive layer on an insulating layer;
  forming at least a first via hole in the insulating layer, the at least one first via hole extending through the insulating layer to a respective underlying conductive structure. wherein forming the conductive layer comprises depositing the conductive layer to cover the insulating layer and filling at least one of the at least a first via hole:
  forming a first set of mandrel lines of a first material above the conductive layer, wherein a mandrel line of the first set of mandrel lines extends across the at least a first via hole, wherein an upper surface of the deposited conductive layer presents a varying topography in a first region above the at least a first via hole, and wherein forming the first set of mandrel lines comprises aligning the first set of mandrel lines using the varying topography in the first region such that the mandrel line of the first set of mandrel lines runs above the first region;
  forming a set of spacer lines of a second material different from the first material, wherein the set of spacer lines are formed on sidewalls of the first set of mandrel lines;
  forming a second set of mandrel lines of a third material different from the first and second materials, wherein the second set of mandrel lines fill gaps between spacer lines of the set of spacer lines;
  cutting at least a first mandrel line of the second set of mandrel lines into two line segments separated by a gap by etching the first mandrel line of the second set of mandrel lines selectively to the set of spacer lines and the first set of mandrel lines;
  cutting at least a first mandrel line of the first set of mandrel lines into two line segments separated by a gap by etching the first mandrel line of the first set of mandrel lines selectively to the set of spacer lines and the second set of mandrel lines;
  removing the set of spacer lines, selectively to the first and second sets of mandrel lines, thereby forming an alternating pattern of mandrel lines of the first set and mandrel lines of the second set; and
  patterning the conductive layer to form a set of conductive lines, wherein the patterning comprises etching while using the alternating pattern of mandrel lines as an etch mask.

2. The method according to claim 1, wherein cutting the first mandrel line of the first set of mandrel lines comprises:
  forming a first cut mask above the first set of mandrel lines, the second set of mandrel lines and the set of spacer lines;
  patterning an opening in the first cut mask, the opening exposing a portion of the first mandrel line of the first set of mandrel lines and having a width greater than a line width of the first mandrel line of the first set of mandrel lines, and
  removing the portion of the first mandrel line of the first set of mandrel lines by etching through the opening of the first cut mask.

3. The method according to claim 1, wherein cutting the first mandrel line of the second set of mandrel lines comprises:
  forming a second cut mask above the first set of mandrel lines, the second set of mandrel lines, and the set of spacer lines;
  patterning an opening in the second cut mask, the opening exposing a portion of the first mandrel line of the second set of mandrel lines and having a width greater than a line width of the first mandrel line of the second set of mandrel lines: and
  removing the portion of the first mandrel line of the second set of mandrel lines by etching through the opening of the second cut mask.

4. The method according to claim 1, wherein forming the first set of mandrel lines comprises:
  forming a first mandrel layer of the first material; and
  patterning the first mandrel layer to form the first set of mandrel lines, wherein the patterning comprises etching the first mandrel layer while using a second set of spacer lines as an etch mask.

5. The method according to claim 1, wherein the first and third material are different materials selected from: a carbon-comprising material, a silicon-comprising material, and wherein the second material is an oxide material or a nitride material.

6. The method according to claim 1, wherein the conductive layer include a layer of ruthenium (Ru), aluminum (Al), tungsten (W), iridium (sr), copper (Cu), cobalt (Co), titanium (Ti), gold (Au), silver (Ag), nickel (Ni) or two or more layers of any of the aforementioned metals.

7. The method according to claim 1, wherein the conductive layer is a Ru-layer.

8. The method according to claim 1, wherein the conductive layer is CVD, atomic layer deposition (ALD), PVD (Physical Vapor Deposition) or electroplated.

9. The method according to claim 1, further comprising forming an intermediate target layer on the conductive layer, wherein the first set of mandrel lines are formed on the intermediate target layer, and wherein the patterning of the conductive layer comprises patterning the intermediate target layer by etching while using the alternating pattern defined by the first and second sets of mandrel lines as an etch mask, and thereafter etching the conductive layer while using at least the patterned intermediate target layer as an etch mask.

10. A method according to claim 1, further comprising forming a further insulating layer covering the insulating layer and embedding the set of conductive lines.

* * * * *